(12) United States Patent
Matsuda

(10) Patent No.: US 9,837,466 B2
(45) Date of Patent: Dec. 5, 2017

(54) METHOD OF MANUFACTURING SEMICONDUCTOR DEVICE

(71) Applicant: RENESAS ELECTRONICS CORPORATION, Tokyo (JP)

(72) Inventor: Shintaro Matsuda, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 27 days.

(21) Appl. No.: 15/078,026

(22) Filed: Mar. 23, 2016

(65) Prior Publication Data

US 2016/0204010 A1 Jul. 14, 2016

Related U.S. Application Data

(63) Continuation of application No. 14/801,813, filed on Jul. 16, 2015, now Pat. No. 9,324,763.

(30) Foreign Application Priority Data

Jul. 29, 2014 (JP) ................. 2014-154312

(51) Int. Cl.
*H01L 21/673* (2006.01)
*H01L 27/146* (2006.01)
(Continued)

(52) U.S. Cl.
CPC .. *H01L 27/14698* (2013.01); *H01L 21/67346* (2013.01); *H01L 21/67356* (2013.01);
(Continued)

(58) Field of Classification Search
CPC ........ H01L 27/14698; H01L 21/67346; H01L 21/67356; H01L 21/67376; H01L 21/67389; H01L 21/6835; H01L 21/6836; H01L 23/055; H01L 27/14618; H01L 27/14687; H01L 2221/68327; H01L 2221/6834
(Continued)

(56) References Cited

U.S. PATENT DOCUMENTS 3,615,006 A * 10/1971 Freed .................. G03F 7/70741
206/454
4,200,191 A * 4/1980 Nakamura ............. B65D 85/30
206/722
(Continued)

FOREIGN PATENT DOCUMENTS

JP 2002-145380 A 5/2002

*Primary Examiner* — Chun Cheung
(74) *Attorney, Agent, or Firm* — Shapiro, Gabor and Rosenberger, PLLC

(57) ABSTRACT

To protect a plurality of semiconductor chips of a sawn wafer housed in a shipping case and a method of manufacturing a semiconductor device includes a step of vacuum packing a sawn wafer while being housed in a shipping case; the shipping case has the following structure: the shipping case has a lid portion that covers the upper surface of the sawn wafer and a body portion that covers the lower surface of the sawn wafer, the lid portion has a recess portion that covers a plurality of semiconductor chips and a ventilation route communicated with the recess portion. In a step of reducing pressure in the shipping case, a gas in the shipping case is discharged outside via a ventilation route.

19 Claims, 18 Drawing Sheets

(51) Int. Cl.
*H01L 21/683* (2006.01)
*H01L 23/055* (2006.01)

(52) U.S. Cl.
CPC .. *H01L 21/67376* (2013.01); *H01L 21/67389* (2013.01); *H01L 21/6835* (2013.01); *H01L 21/6836* (2013.01); *H01L 23/055* (2013.01); *H01L 27/14618* (2013.01); *H01L 27/14687* (2013.01); *H01L 2221/6834* (2013.01); *H01L 2221/68327* (2013.01); *H01L 2221/68381* (2013.01); *H01L 2224/05554* (2013.01); *H01L 2224/32225* (2013.01); *H01L 2224/48091* (2013.01); *H01L 2224/48227* (2013.01); *H01L 2224/48465* (2013.01); *H01L 2224/49175* (2013.01); *H01L 2224/73265* (2013.01); *H01L 2924/15184* (2013.01); *H01L 2924/15311* (2013.01); *H01L 2924/16195* (2013.01)

(58) Field of Classification Search
USPC .......................................... 206/711, 832, 701
See application file for complete search history.

(56) References Cited

U.S. PATENT DOCUMENTS

| | | | | |
|---|---|---|---|---|
| 4,203,127 A | * | 5/1980 | Tegge, Jr. | H01L 21/67132 206/454 |
| 5,163,551 A | * | 11/1992 | Bhatia | H05K 13/0084 206/725 |
| 5,695,068 A | * | 12/1997 | Hart | B65D 85/38 206/486 |
| 6,003,674 A | | 12/1999 | Brooks | |
| 6,119,865 A | * | 9/2000 | Kawada | H01L 21/67369 206/303 |
| 6,164,454 A | * | 12/2000 | Freund | H01L 21/67346 206/497 |
| 7,222,737 B2 | * | 5/2007 | Caparro | B07C 5/36 206/710 |
| 2003/0070517 A1 | * | 4/2003 | Tsujimoto | B29C 63/0013 83/13 |
| 2003/0162313 A1 | * | 8/2003 | Kim | H01L 21/6835 438/33 |
| 2014/0070411 A1 | * | 3/2014 | Okada | H01L 21/50 257/737 |

* cited by examiner

METHOD OF MANUFACTURING SEMICONDUCTOR DEVICE

CROSS-REFERENCE TO RELATED APPLICATIONS

The disclosure of Japanese Patent Application No. 2014-154312 filed on Jul. 29, 2014 including the specification, drawings, and abstract is incorporated herein by reference in its entirety.

BACKGROUND

The present invention relates to a technology of manufacturing a semiconductor device, for example, a technology effective when applied to a method of manufacturing a semiconductor device including a step of dicing a semiconductor wafer fixed to a ring and packing the semiconductor wafer thus divided into a plurality of semiconductor chips while supporting it by the ring.

Japanese Patent Laid-Open No. 2002-145380 (Patent Document 1) describes a shipping box for housing therein a stacked plurality of dicing frames having a divided semiconductor wafer attached to a dicing tape.

[Patent Document 1] Japanese Patent Laid-Open No. 2002-145380

SUMMARY

When a semiconductor wafer divided into a plurality of semiconductor chips is conveyed to a semiconductor chip mounting place, the semiconductor chips obtained by dicing, attached to an adhesive tape, and supported by a ring are sometimes conveyed while being packed. Such a wafer may be called "diced semiconductor wafer on ring", but it will hereinafter be called "sawn wafer".

From the standpoint of preventing semiconductor chips from being damaged during conveyance, a shipping case of a sawn wafer has preferably a structure in which the ring can be fixed to the shipping case. In addition, from the standpoint of suppressing oxidation of semiconductor chips and components of a circuit which the semiconductor chips have, the shipping case of a sawn wafer has preferably a structure in which a pressure-reduced environment can be maintained around the semiconductor wafer by sucking a gas from the shipping case.

Study by the present inventors has, however, revealed that in some structures of a shipping case of a sawn wafer, individual semiconductor chips housed in the shipping case may be damaged at the time when the environment around the semiconductor wafer is returned from a pressure reduced state to a normal pressure state.

Other problems and novel features will be apparent from the description herein and accompanying drawings.

In one embodiment, there is provided a method of manufacturing a semiconductor device having a step of forming a sawn wafer, that is, a semiconductor wafer diced and thereby divided into a plurality of semiconductor chips and supported by a ring while being attached to an adhesive tape. The method of manufacturing a semiconductor device has further a step of housing the sawn wafer in a shipping case having a first case portion that covers a first face of the sawn wafer to which the semiconductor wafer has been attached and a second case portion that covers a second face of the sawn wafer on the side opposite to the first face. The method of manufacturing a semiconductor device has still further a step of housing the shipping case in a shipping bag and sucking a gas from the shipping bag to reduce the pressure in the shipping case. The first case portion has a first recess portion that covers the semiconductor chips and a first ventilation route that is communicated with the first recess portion. In the step of reducing the pressure in the shipping case, the gas in the shipping case is discharged outside via the first ventilation route.

According to the one embodiment, the semiconductor chips of the sawn wafer housed in the shipping case can be protected.

DETAILED DESCRIPTION

Figure 1:
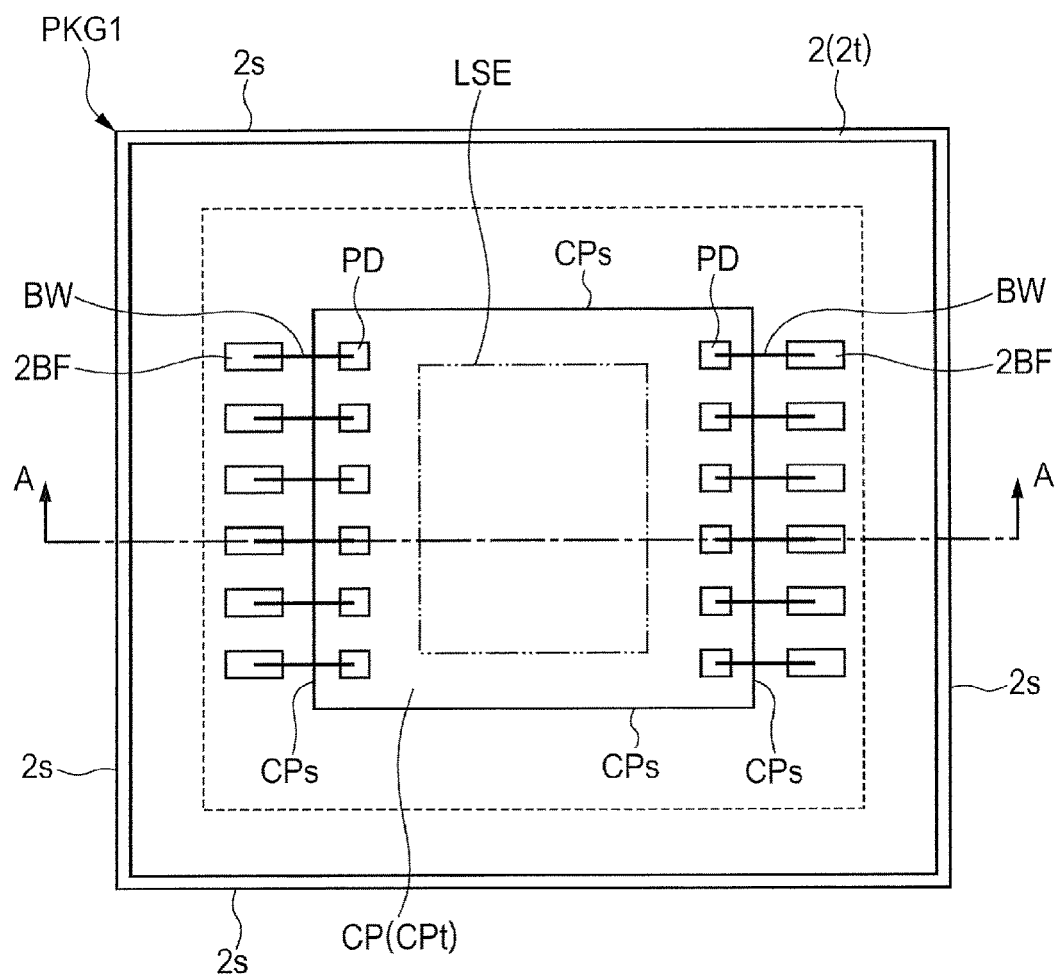
FIG. 1 is a top view of a semiconductor package (semiconductor device) according to First Embodiment.

[Explanation of Description Manner, Basic Terms, and Usage in the Present Application]

In the application, a description in an embodiment may be made after divided in a plurality of sections if necessary for the sake of convenience. These sections are not independent from each other, but they may each be a part of a single example or one of them may be a partial detail of the other or a modification example of a part or whole of the other one unless otherwise particularly specified. In principle, a description of a portion similar to that described before is not repeated. Moreover, when a reference is made to constituent components in the embodiment, they are not essential unless otherwise particularly specified, limited to the number theoretically, or apparent from the context.

Similarly, in the description of the embodiment and the like, the term "X made of A" or the like with regard to a material, composition, or the like does not exclude a member containing a component other than A unless otherwise particularly specified or unless otherwise evident from the context. For example, with regard to a component, the above term means "X containing A as a principal component" or the like. It is needless to say that for example, the term "silicon member" or the like is not limited to pure silicon but it may include a multicomponent alloy having silicon as a principal component such as SiGe alloy and a member containing an additive in addition. Similarly, the term "gold plating", "Cu layer", "nickel plating", or the like includes not only a pure member but also a member containing gold, Cu, nickel, or the like as a principal component, respectively, unless otherwise particularly specified.

When a reference is made to a specific numerical value or amount, it may be more than or less than the specific numerical value or amount unless otherwise particularly specified, limited to the specific numerical value or amount theoretically, or apparent from the context.

In all the drawings in the embodiment, the same or like members will be identified by the same or like symbols or reference numerals and overlapping descriptions will be omitted in principle.

In the present application, an individual piece obtained by forming an integrated circuit on a semiconductor wafer having a plurality of device regions and dividing it into individual device regions will hereinafter be called "semiconductor chip". A semiconductor chip mounted on a base material such as lead frame or wiring board and electrically coupled to a terminal which the base material has will hereinafter be called "semiconductor package".

In the present application, electronic parts having a circuit (integrated circuit) making use of a semiconductor material will hereinafter be collectively called "semiconductor device". The term "semiconductor device" therefore embraces the above-mentioned semiconductor chip and semiconductor package. It also embraces a package having a plurality of semiconductor chips packed therein.

In the accompanying drawings, hatching or the like is sometimes omitted even from the cross-section when it makes the drawing complicated or when a member can be distinguished clearly from a vacant space. In relation thereto, even a planarly closed hole may be shown without a background contour thereof when it is obvious from the description or the like that the hole is planarly closed. On the other hand, in order to clearly show that a region is not a vacant space or to clearly show a boundary of regions, hatching or a dot pattern may be added even when the drawing is not a cross-sectional view.

(First Embodiment) <Semiconductor Package>

Figure 2:
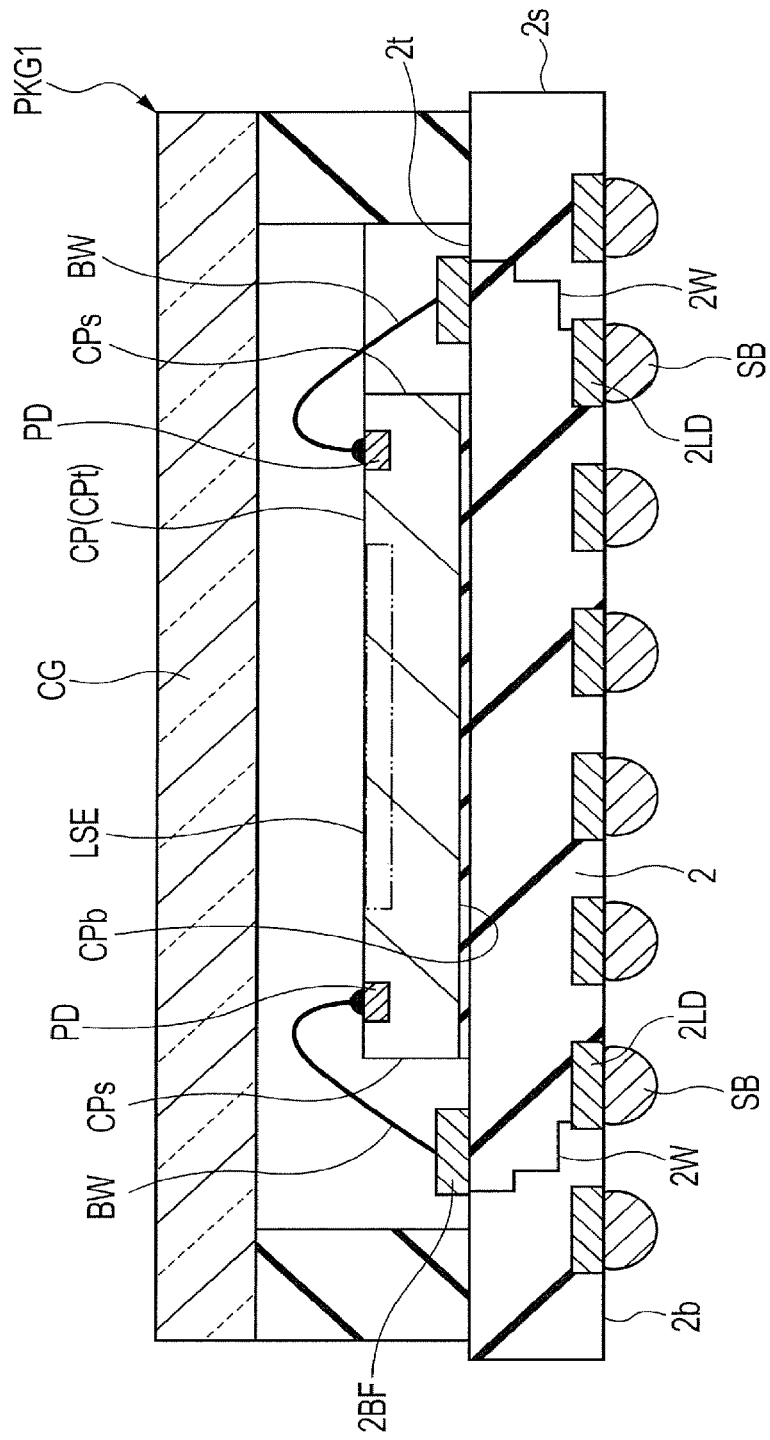
FIG. 2 is a cross-sectional view taken along the line A-A of FIG. 1.

The outline constitution of a semiconductor package (semiconductor device) PKG1 of the present embodiment will be described referring to FIGS. 1 and 2. The semiconductor package PKG1 of the present embodiment is equipped with a wiring board 2 and a semiconductor chip (semiconductor device) CP mounted on the wiring board 2. FIG. 1 is a top view of the semiconductor package (semiconductor device) of the present embodiment. FIG. 2 is a cross-sectional view taken along the line A-A of FIG. 1. In FIGS. 1 and 2, in order to facilitate understanding of an arrangement region of a plurality of image sensor elements (light receiving elements) formed on the side of a main surface CPt of the semiconductor chip CP, the arrangement region of image sensor elements is surrounded by a two-dot chain line and is marked with LSE.

As shown in FIG. 2, the wiring board 2 has an upper surface (surface, main surface, first surface, or a chip mounting surface) 2t having the semiconductor chip CP thereon, a lower surface (surface, main surface, second surface, or packaging surface) 2b which is on a side opposite to the upper surface 2t, and a side surface 2s placed between the upper surface 2t and the lower surface 2b. It has, as shown in FIG. 1, a square outer shape in plan view.

The wiring board 2 has, on the upper surface 2t thereof, a plurality of terminals (bonding leads, bonding fingers, or semiconductor chip coupling terminals) 2BF to be coupled electrically to the semiconductor chip CP. As shown in FIG. 2, the wiring board 2 has, on the lower surface 2b thereof, a plurality of lands 2LD serving as external input/output terminals of the semiconductor package PKG1. The terminals 2BF and the lands 2LD are electrically coupled to each other via a plurality of wirings 2W formed in the wiring board 2. In the example shown in FIG. 2, solder balls (solder materials, external terminals, electrodes, or external electrodes) SB are coupled to the lands 2LD, respectively. When the semiconductor package PKG1 is packaged on an unillustrated package substrate, the solder balls SB serve as conductive members that electrically couple a plurality of terminals (not illustrated) on the side of the package substrate to the lands 2LD.

The semiconductor package PKG1 has the semiconductor chip CP to be mounted on the wiring board 2. As shown in FIG. 2, each semiconductor chip CP has a main surface (surface or upper surface) CPt, a main surface (back surface or lower surface) CPb on the side opposite to the main surface CPt, and a side surface CPs positioned between the main surface CPt and the main surface CPb. As shown in FIG. 1, it has a square outer shape smaller in plane area than that of the wiring board 2 in plan view.

The semiconductor chip CP has, on the main surface CPt thereof, a plurality of pads (bonding pads, chip electrodes) PD and in the present embodiment, the pads PD are formed along each side (along the side surface CPs) of the main surface CPt. In the example shown in FIG. 2, the semiconductor chip CP is mounted on the wiring board 2 while being placed so that the main surface CPb faces the upper surface 2t of the wiring board 2. Such a mounting method is called "face-up packaging method".

The semiconductor chip CP (more specifically, a base material of the semiconductor chip CP) is made of, for example, silicon (Si). It has, on the main surface CPt thereof, an insulating film that covers the base material of the semiconductor chip CP and wirings. The respective surfaces of the pads PD are exposed, at opening portions formed in this insulating film, from the insulating film. The pads PD are each made of a metal and in the present embodiment, they are made of, for example, aluminum (Al).

In the example shown in FIGS. 1 and 2, the semiconductor chip CP having, on the side of the main surface CPt thereof, a plurality of image sensor elements (light receiving elements) LSE is a so-called image sensor chip. The image sensor elements are, for example, solid-state image sensors using, for example, CMOS (Complementary Metal Oxide Semiconductor). The image sensor elements LSE formed on the side of the main surface CPt of the semiconductor chip CP are electrically coupled to the pads PD formed at the periphery of the main surface CPt.

The pads PD of the semiconductor chip CP are electrically coupled to the terminals 2BF of the wiring board 2 via a plurality of wires (conductive members) BW made of a metal material, for example, gold (Au) or copper (Cu). In a semiconductor package having a sensor chip such as image sensor chip, a sensor portion is often required to be made visible. In the example shown in FIGS. 1 and 2, therefore, the semiconductor chip CP is mounted by the face-up packaging method and the semiconductor chip CP and the wiring board 2 are electrically coupled to each other by the wires BW.

When the semiconductor chip CP and the wiring board 2 are electrically coupled to each other via the wires BW, a coupled portion via the wires BW must be protected. In the example shown in FIGS. 1 and 2, therefore, the semiconductor chip CP and the wires BW are covered with a cover member CG which is transparent to visible light.

In FIGS. 1 and 2, the wiring board 2 is shown exemplary as a base material on which the semiconductor chip CP is to be mounted, but there are various modification examples. For example, the semiconductor chip CP can be mounted on a chip mounting portion of an unillustrated metal lead frame.

As a modification example of FIGS. 1 and 2, a semiconductor chip which is not a sensor chip can be used instead. In this case, the semiconductor chip may be covered with, for example, a black resin so that the semiconductor chip CP and the wires BW may be sealed with a resin. As another modification example, the semiconductor chip may be mounted on the wiring board 2 so that the main surface CPt, which is a formation surface of the pads PD of a semiconductor element, faces the upper surface 2t of the wiring board by a face-down mounting method. In this case, the wires BW may be replaced by a plurality of protruding electrodes bonded to the pads PD and the semiconductor chip CP and the wiring board 2 can be electrically coupled to each other via them.

<Method of Manufacturing a Semiconductor Device>

Figure 3:
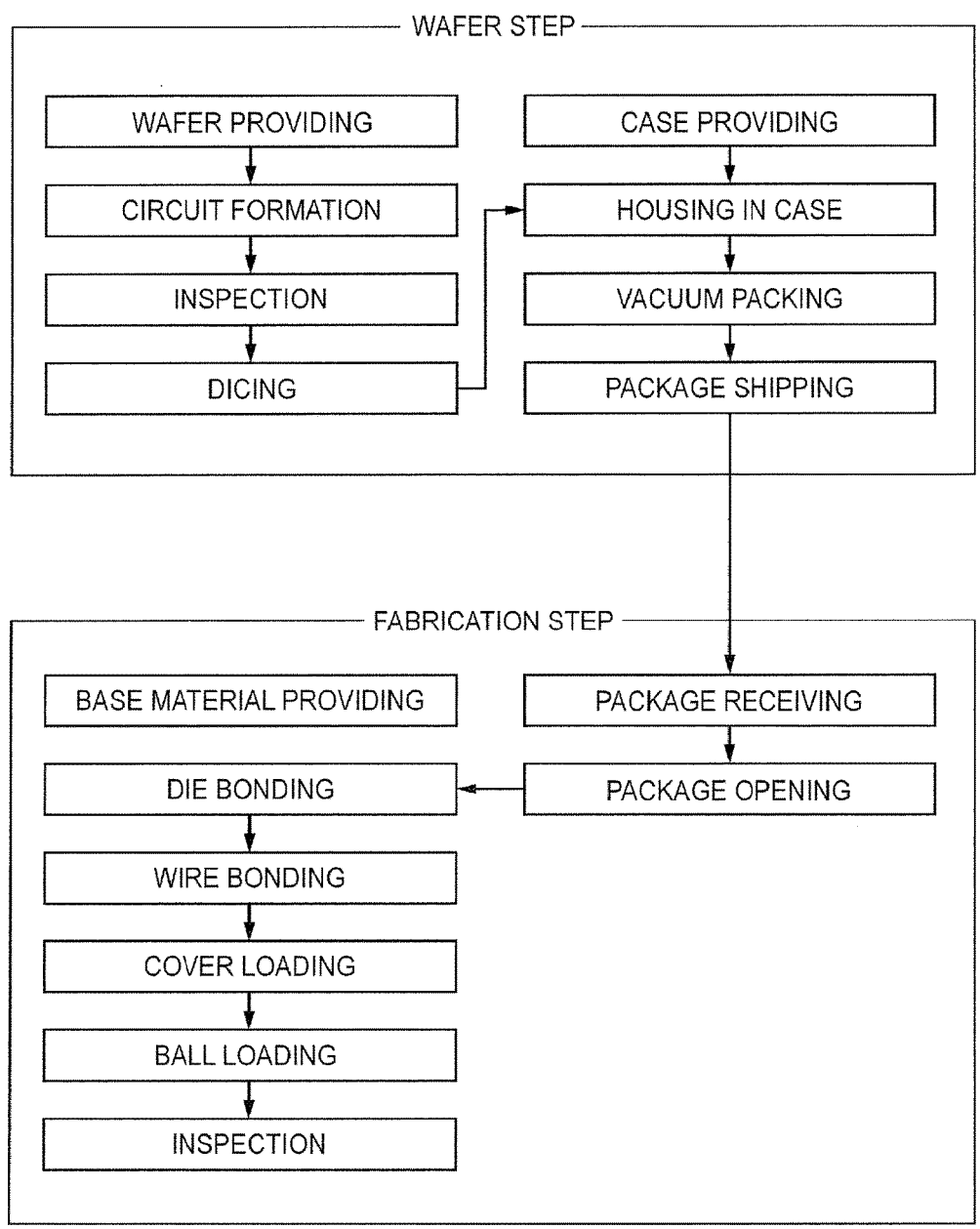
FIG. 3 is an explanatory view showing the outline of manufacturing steps of the semiconductor package described referring to FIGS. 1 and 2.

Next, manufacturing steps of the semiconductor package PKG1 described referring to FIGS. 1 and 2 will be described. In the present embodiment, a mode in which a step (wafer step) of manufacturing the semiconductor chip CP shown in FIG. 1 and a step (fabrication step) of fabricating a semiconductor package are performed at respectively difference places will be described. In this case, after the wafer step, a completed semiconductor chip must be packed and then conveyed. FIG. 3 is an explanatory view showing the outline of manufacturing steps of the semiconductor package described referring to FIGS. 1 and 2.

<Wafer Step>

Figure 4:
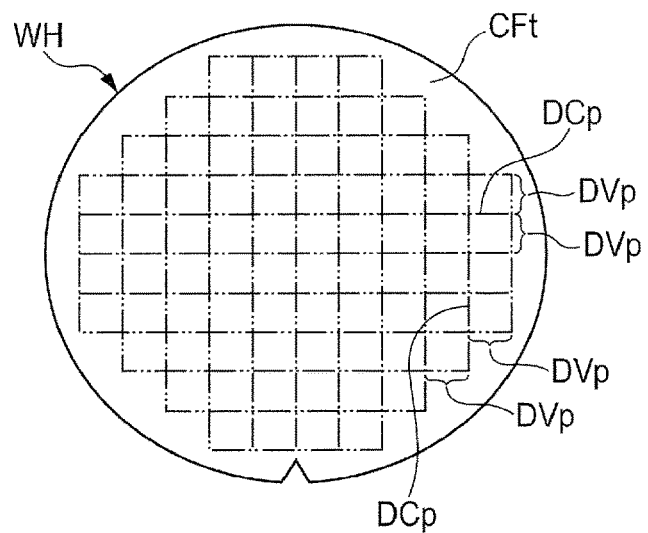
FIG. 4 is a plan view of a semiconductor wafer, on the side of a circuit formation surface, provided in the wafer providing step shown in FIG. 3.

In the wafer step shown in FIG. 3, a wafer providing step is performed by providing a semiconductor wafer WH (refer to FIG. 4) which is a substrate made of a semiconductor material, for example, silicon (Si). FIG. 4 is a plan view showing a circuit formation surface side of the semiconductor wafer provided in the wafer providing step shown in FIG. 3. The semiconductor wafer WH to be provided in the wafer providing step has a plurality of device regions DVp. A visible line is not always necessary at a boundary between the device regions DVp adjacent to each other. In FIG. 4, the boundary of the device regions DVp, that is, a dicing line DCp is indicated by a two-dot chain line in order to clearly show the presence of the device regions DVp.

The semiconductor wafer WH shown in FIG. 4 has a circuit formation surface CFt and a back surface on the side opposite to the circuit formation surface CFt. In plan view, the semiconductor wafer WH has a plurality of device regions DVp and dicing lines (scribe regions) DCp positioned between the device regions DVp.

As the circuit formation step shown in FIG. 3, a circuit including a plurality of semiconductor elements is formed on the circuit formation surface CFt of the semiconductor wafer WH. In this step, a plurality of semiconductor elements, a plurality of pads (refer to FIG. 1), and a plurality of wirings for electrically coupling the semiconductor elements to the pads PD are formed. The semiconductor elements are electronic circuit elements such as transistors or diodes and are formed by introducing an impurity into a semiconductor material. As described above, in the present embodiment, an image sensor element LSE (refer to FIG. 1) such as a CMOS sensor is formed. The image sensor element LSE is comprised of a plurality of semiconductor elements. Although illustration is omitted in FIGS. 1 and 2, the image sensor element LSE has thereabove a plurality of lenses (microlenses). In the present embodiment, therefore, the image sensor element LSE, a plurality of wirings to be electrically coupled to the image sensor element LSE, and a plurality of pads PD (refer to FIG. 1) are formed in this circuit formation step.

Figure 6:
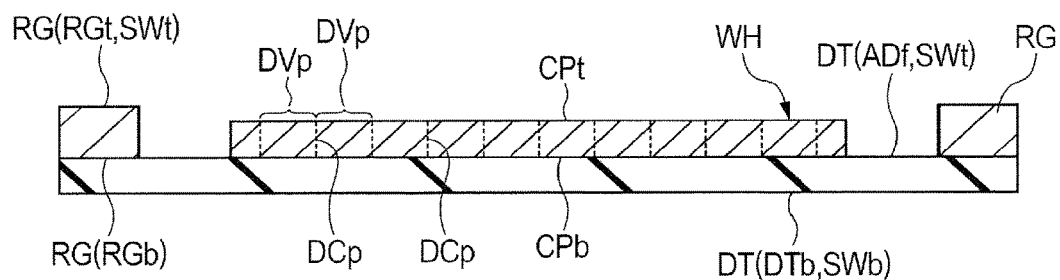
FIG. 6 is a cross-sectional view showing the semiconductor wafer attached to a dicing tape in the cross-section taken along the line A-A of FIG. 5.

In the circuit formation step shown in FIG. 3, a wiring layer is stacked over the circuit formation surface CFt of the semiconductor wafer WH shown in FIG. 4. The main surface CPt of the semiconductor chip shown in FIG. 2 is an upper surface of the semiconductor wafer WH having thereon a circuit obtained by stacking a wiring layer. When the cross-section of the semiconductor wafer WH having a circuit thereon is indicated, the upper surface of the semiconductor wafer WH is indicated as the main surface CPt, for example, as shown in FIG. 6.

In the inspection step shown in FIG. 3, an electrical test or the like of the circuit formed on the semiconductor wafer WH in the circuit formation step is performed. As the electrical test, for example, a conduction test, a test for checking the electrical characteristics of the circuit, or the like can be performed.

Although not illustrated in FIG. 3, the circuit formation step may be followed by a back grinding step in which the back surface of the semiconductor wafer WH is ground to reduce the thickness of the semiconductor wafer. When the back grinding step is performed, the semiconductor wafer WH can be thinned after the circuit formation step. This makes it possible to improve handling of the semiconductor wafer WH in the circuit formation step and at the same time, to provide a semiconductor chip CP (refer to FIG. 1) having a decreased thickness. The back grinding step can also be performed after the inspection step but before the dicing step shown in FIG. 3. It is however preferred to carry out this step before the inspection step from the standpoint of inspecting the influence of the back grinding step on the circuit.

When the back grinding step is performed, the main surface CPb of the semiconductor chip CP shown in FIG. 2 is a surface exposed after grinding. When the back grinding step is not performed, the main surface CPb of the semiconductor chip CP shown in FIG. 2 is the same as the back surface of the semiconductor wafer WH positioned on the side opposite to the circuit formation surface CFt shown in FIG. 4. In the steps after the dicing step shown in FIG. 3, when the cross-section of the semiconductor wafer WH is indicated, the lower surface of the semiconductor wafer WH is indicated as the main surface CPb as shown, for example, in FIG. 6 later.

Figure 5:
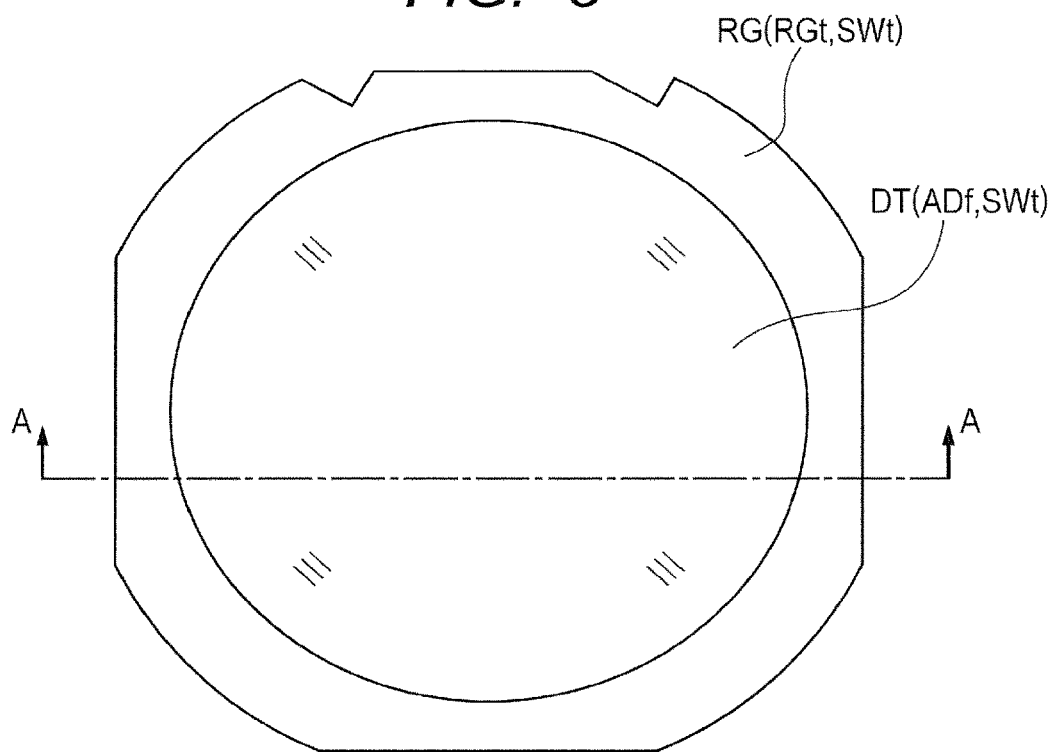
FIG. 5 is a plan view showing a support member of the semiconductor wafer to be used in the dicing step shown in FIG. 3.
Figure 7:
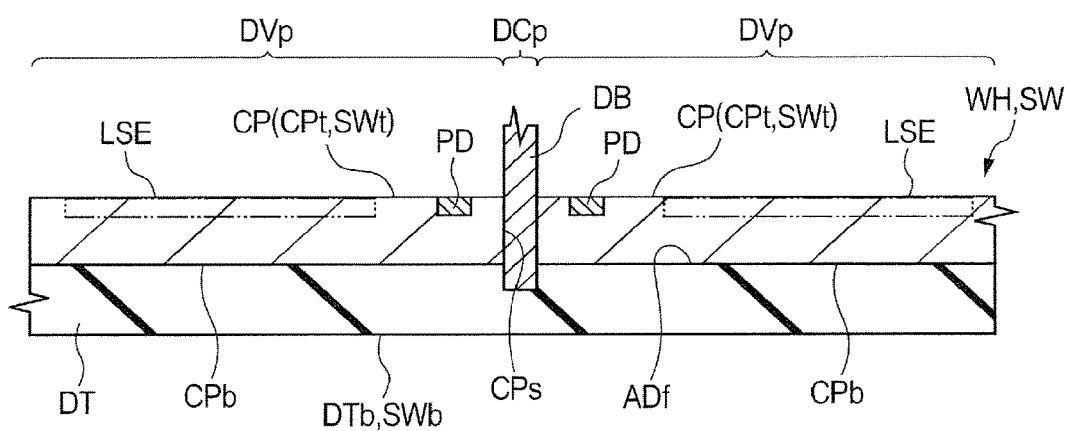
FIG. 7 is an enlarged cross-sectional view showing the semiconductor wafer of FIG. 6 diced along a dicing line.
Figure 8:
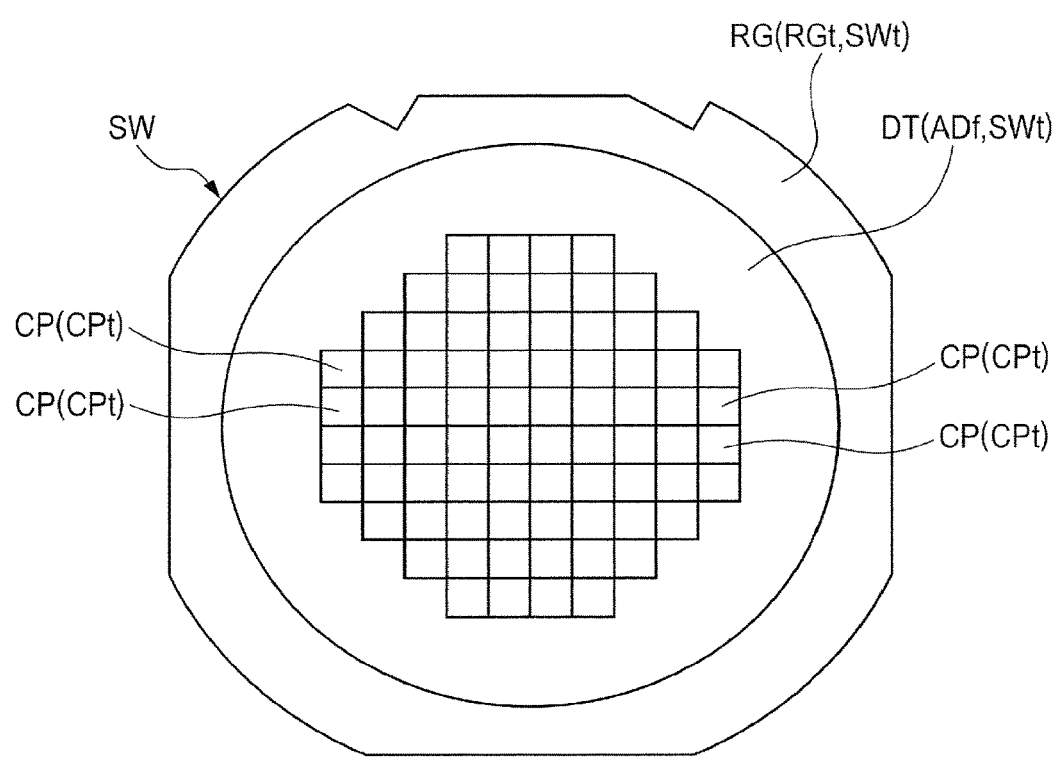
FIG. 8 is a plan view of a sawn wafer obtained after the dicing step shown in FIG. 3.

Next, in the dicing step shown in FIG. 3, the semiconductor wafer WH is diced into individual device regions CVp along the dicing line DCp shown in FIG. 4 to obtain a plurality of semiconductor chips CP (refer to FIG. 7). FIG. 5 is a plan view showing a support member of the semiconductor wafer to be used in the dicing step shown in FIG. 3. FIG. 6 is a cross-sectional view of the semiconductor wafer attached to a dicing tape in the cross-section taken along a line A-A of FIG. 5. FIG. 7 is an enlarged cross-sectional view showing the semiconductor wafer of FIG. 6 diced along a dicing line. FIG. 8 is a plan view of a sawn wafer obtained after the dicing step shown in FIG. 3.

FIG. 5 shows the side of an adhesive surface ADf of a ring RG to which the semiconductor wafer WH (refer to FIG. 6) is attached. As described above, the semiconductor wafer WH has a plurality of device regions DVp but a visible line is not always necessary at the boundary of the device regions DVp. In FIG. 6, the boundary of the device regions DVp, that is, a dicing line DCp is indicated by a dotted line in order to clearly show the presence of the plurality of device regions DVp.

The dicing step includes a ring providing step, that is, a step of providing a ring RG to which a dicing tape (adhesive sheet) DT has been attached as shown in FIG. 5. The dicing step also includes a wafer attaching step, that is, a step of attaching the semiconductor wafer WH onto the dicing tape DT so as to, as shown in FIG. 6, face the main surface CPb of the semiconductor wafer WH to the adhesive surface ADf of the dicing tape DT positioned inside the ring RG. The dicing step also has a sawn wafer formation step, that is, a step of forming a sawn wafer SW by dicing the semiconductor wafer WH into a plurality of semiconductor chips CP as shown in FIG. 7.

The ring RG provided in the ring providing step is a support frame having an annular planar shape as shown in FIG. 5 and it has, as shown in FIG. 6, an upper surface RGt and a lower surface RGb on the side opposite to the upper surface RGt. The dicing tape DT attached to the ring RG is a resin film and the resin film has, on one side thereof, an adhesive surface (adhesion surface, upper surface) ADf on which an adhesive layer containing an adhesive material has been formed. The adhesiveness of the lower surface DTb on the side opposite to the adhesive surface is slightly lower than that of the adhesive surface.

By closely attaching the semiconductor wafer WH and ring RG to the adhesive surface ADf of the dicing tape DT, the semiconductor wafer WH and ring RG are attached thereto by the adhesion force of the adhesive surface ADf. In the example shown in FIG. 6, the adhesive surface ADf of the dicing tape DT is attached to the lower surface RGb of the ring RG.

Since the base material of the dicing tape DT is a resin film, application of force thereto causes shrinkage of the base material to some extent. During attaching the dicing tape DT to the lower surface RGb of the ring RG, it is therefore preferred to attach the dicing tape DT while stretching it and thereby preventing occurrence of slack or wrinkles of the tape facing the semiconductor wafer WH.

The adhesive material placed on the adhesive surface ADf contains, for example, an ultraviolet curing resin. Upon picking up the semiconductor chip CP (refer to FIG. 7) attached to the dicing tape DT, the semiconductor chip CP is picked up after exposure of the dicing tape DT to ultraviolet rays. This facilitates release of the semiconductor chip CP from the dicing tape DT.

Next, in the wafer attaching step, as shown in FIG. 6, the main surface CPb of the semiconductor wafer WH is attached to the adhesive surface ADf of the dicing tape DT to fix the semiconductor wafer WH to the ring RG via the dicing tape DT. As shown in FIG. 6, when the main surface CPb of the semiconductor wafer WH is attached to the dicing tape DT, the main surface CPt on the side of the circuit formation surface is exposed.

Next, in the sawn wafer formation step, the semiconductor wafer WH is diced along the dicing line DCp as shown in FIG. 7. For example, in the example shown in FIG. 7, the semiconductor wafer WH is divided into individual device regions DVp by cutting the wafer along the dicing line DCp by a blade (dicing blade) DB which is a cutting tool. The blade DB is a disk-shaped plate member and it has abrasive grains at the periphery of the disk. The semiconductor wafer SH is diced by this disk-shaped blade DB moved along the dicing line DCp while being rotated in a circumferential direction of the disk. Since the semiconductor wafer WH has adhered to the dicing tape DT during dicing, cutting processing can be carried out while fixing the semiconductor wafer WH to the tape. In addition, the main surface CPb of the semiconductor chips CP obtained by dicing has adhered to the dicing tape DT so that the semiconductor chips CP can be prevented from scattering therearound after dicing.

After division of the semiconductor wafer WH, a washing step is performed to remove cutting sawdust. In this washing step, component portions (for example, an end member at the periphery) of the semiconductor wafer WH other than the semiconductor chips CP may be removed together with the sawdust. In this case, for example, a portion to be removed is selectively exposed to ultraviolet rays. This makes it possible to selectively release the end member to be removed from the dicing tape DT without releasing the semiconductor chips CP from the dicing tape DT.

By the steps described above, a sawn wafer (semiconductor device) SW shown in FIG. 8 is formed. The sawn wafer SW shown in FIG. 8 is a "diced semiconductor wafer on ring". In it, the plurality of semiconductor chips CP is supported by the ring RG while being attached to the dicing tape DT.

Figure 9:
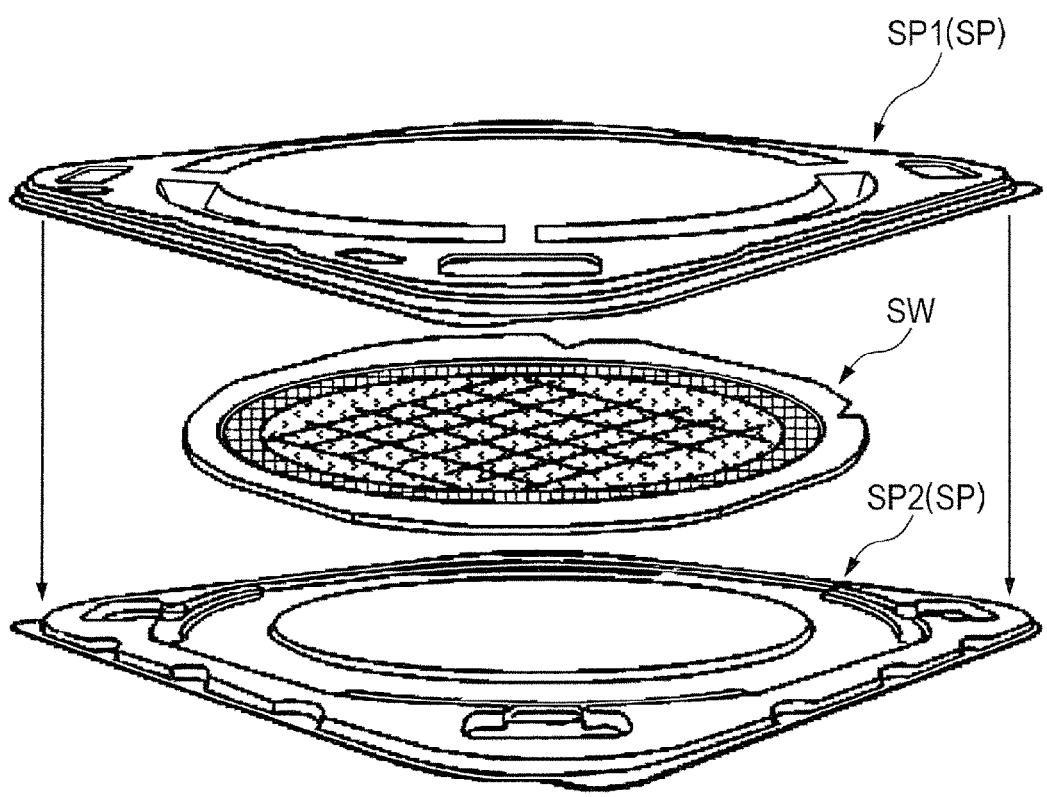
FIG. 9 is a fabrication perspective view showing the sawn wafer of FIG. 8 housed in a shipping case.
Figure 10:
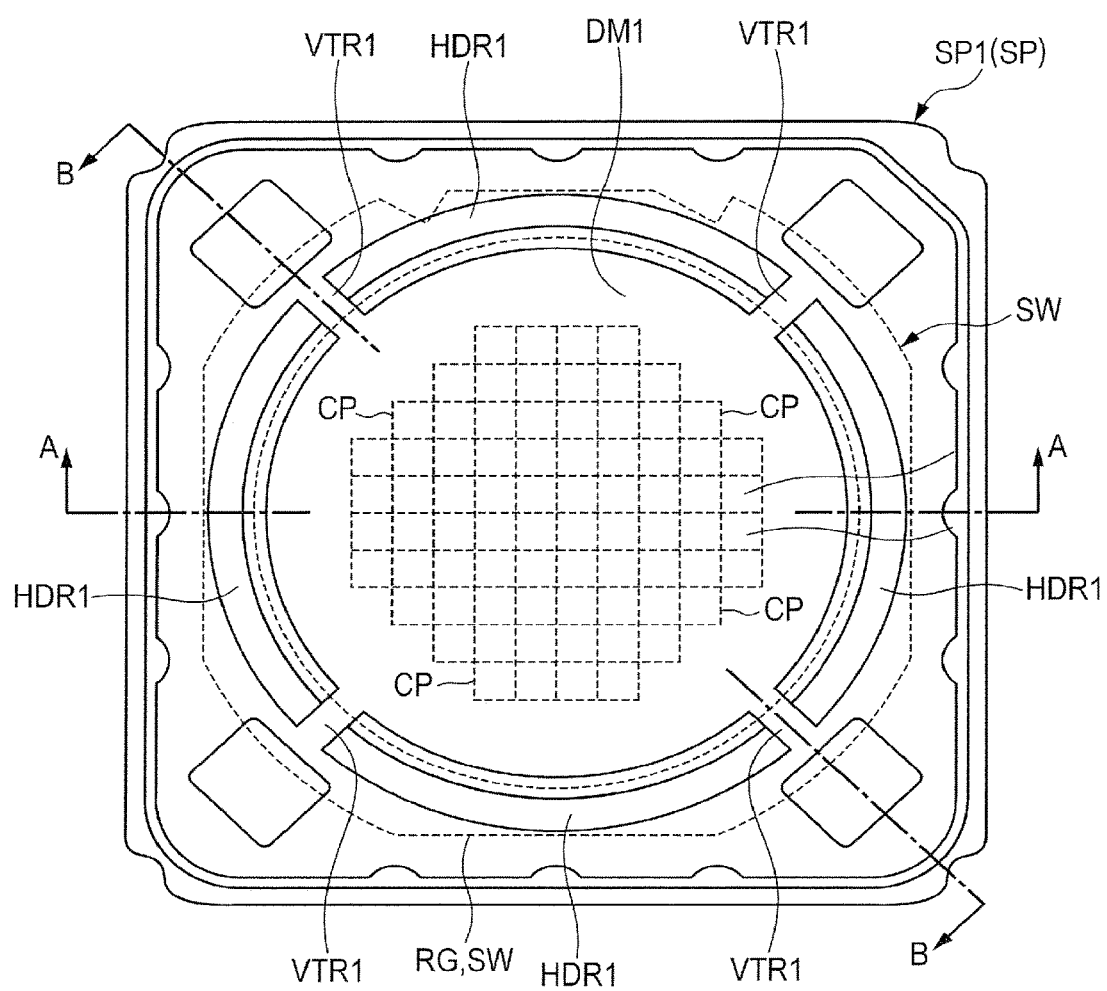
FIG. 10 is a plan view of a lid portion of the shipping case of FIG. 9 viewed from the top.
Figure 11:
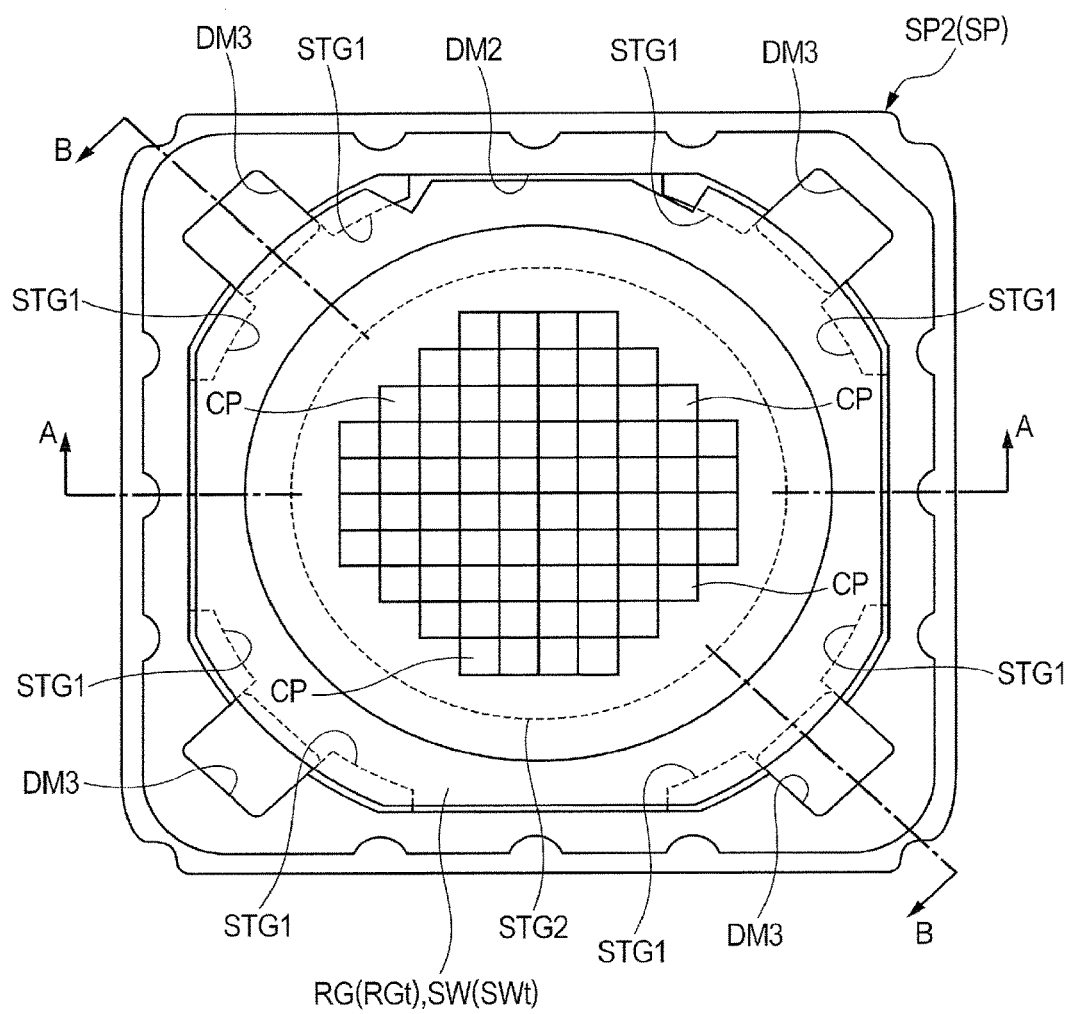
FIG. 11 is a plan view of a body portion of the shipping case of FIG. 9 viewed from the top.
Figure 12:
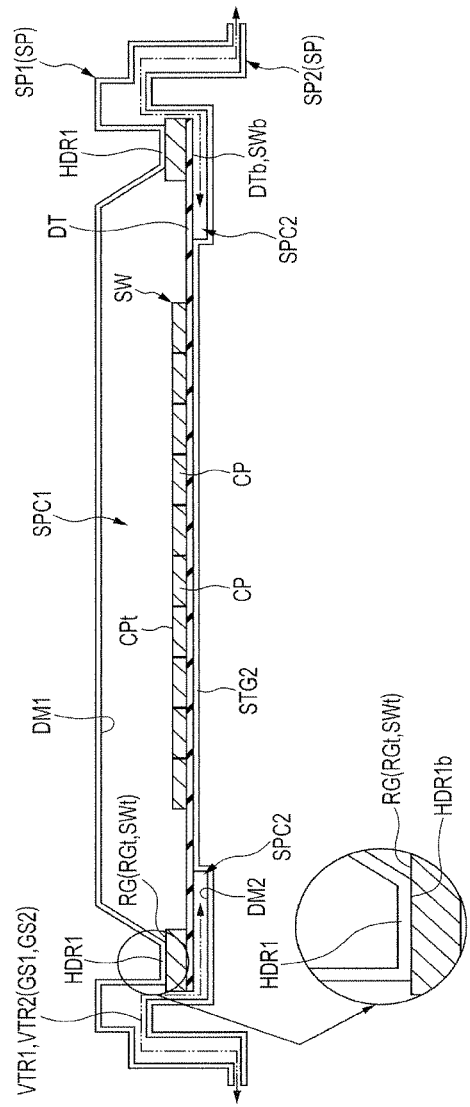
FIG. 12 is a cross-sectional view showing the sawn wafer packed in the shipping case in the cross-section taken along the line A-A of FIGS. 10 and 11.
Figure 13:
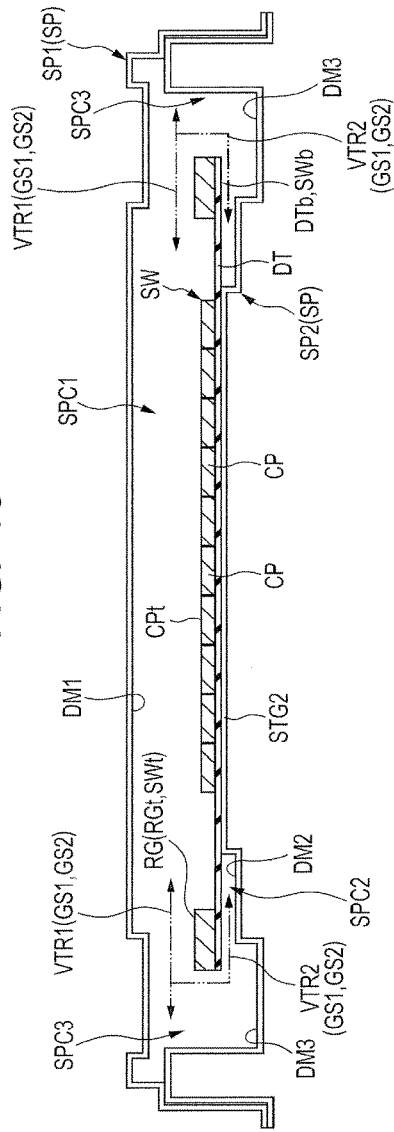
FIG. 13 is a cross-sectional view showing the sawn wafer packed in the shipping case in the cross-section taken along the line B-B of FIGS. 10 and 11.

Next, in the case providing step shown in FIG. 3, a shipping case SP for housing therein the sawn wafer SW as shown in FIG. 9 is provided. FIG. 9 is a fabrication perspective view showing the sawn wafer of FIG. 8 housed in a shipping case. FIG. 10 is a plan view of a lid portion of the shipping case of FIG. 9 viewed from the top. FIG. 11 is a plan view of a body portion of the shipping case of FIG. 9 viewed from the top. FIG. 12 is a cross-sectional view showing the sawn wafer packed in the shipping case in the cross-section taken along the line A-A of FIGS. 10 and 11. FIG. 13 is a cross-sectional view showing the sawn wafer packed in the shipping case in the cross-section taken along the line B-B of FIGS. 10 and 11.

In FIGS. 10 and 11, in order to show a planar positional relationship between the shipping case SP and the sawn wafer SW, the sawn wafer SW covered with the lid portion SP1 is indicated by a dotted line in FIG. 10, while a portion of the body portion SP2 covered with the sawn wafer SW is indicated by a dotted line in FIG. 11. In FIGS. 12 and 13, a ventilation route for enabling ventilation of gases GS1 and gas GS2 between an internal space and an external space of the shipping case SP is schematically shown by a two-dot chain line.

In the housing-in-case step shown in FIG. 3, the sawn wafer SW is housed in the shipping case SP. The shipping case SP is a housing container used for conveying a sawn wafer and it houses the sawn wafer SW sandwiched between the lid portion (first case portion) SP1 and the body portion (second case portion) SP2 as shown in FIG. 9.

From the standpoint of preventing the semiconductor chips CP (refer to FIG. 8) from being damaged during conveyance of the sawn wafer, the semiconductor chips CP are preferably fixed so as to prevent their movement in the case. Since the plurality of semiconductor chips CP of the sawn wafer SW is supported by the ring RG (refer to FIG. 8) via the dicing tape DT (refer to FIG. 8) as described above, the movement of the semiconductor chips CP during conveyance can be prevented by fixing the ring RG.

In the present embodiment, as shown in FIG. 11, the body portion SP2 is equipped with a recess portion DM2 for housing the sawn wafer SW therein and a plurality of support portions STG1 formed in the recess portion DM2. The sawn wafer SW is housed in the recess portion DM2 formed in the body portion SP2. The support portions STG1 are portions (swelling portions) that swell upward relative to the bottom surface of the recess portion DM2. When the sawn wafer SW is placed in the recess portion DM2, the lower surface DTb of the dicing tape DT attached to the lower surface RGb of the ring RG shown in FIG. 6, that is, the periphery of the lower surface SWb of the sawn wafer SW comes into contact with the support portions STG1. In other words, the support portions STG1 have each a support face that comes into contact with a portion of the sawn wafer SW to support it.

On the other hand, as shown in FIG. 12, the lid portion SP1 has a recess portion DM1 that covers the plurality of semiconductor chips CP and a ring holding portion HDR1 that holds, outside the recess portion DM1, the upper surface RGt of the ring RG of the sawn wafer SW. The ring holding portion HDR1 is formed at a position contiguous to the upper surface RGt of the ring RG and it fixes the ring RG by pressing the ring RG from the side of the upper surface RGt.

In the shipping case SP, a space formed between the lid portion SP1 and the body portion SP2 superimposed on each other can have improved air tightness. As will be described in detail later, with regard to the passage of a gas between the internal space formed between the lid portion SP1 and the body portion SP2 and an external space of the shipping case SP, an intentionally created plurality of ventilation routes serves as a main route. By improved air tightness of the shipping case SP, invasion of foreign matters in the shipping case SP can be suppressed and as a result, contamination of the semiconductor chips CP with these foreign matters can be suppressed.

Before housing the sawn wafer SW in the shipping case SP, the shipping case may be washed in advance to make it clean. This makes it possible to reduce the possibility of foreign matters being attached to the plurality of semiconductor chips CP housed in the shipping case SP.

As a modification example of the present embodiment, it is possible to employ a mode in which a plurality of sawn wafers SW, after being stacked one after another, is housed in the shipping case SP. In this case, however, a spacer member having a buffer function must be inserted between the sawn wafers SW from the standpoint of preventing contact between the stacked sawn wafers SW. In addition, an increase in the number of parts to be housed in one shipping case SP may lead to generation of foreign matters due to contact between the parts. From the standpoint of suppressing generation of foreign matters, therefore, a mode of housing one sawn wafer SW in one shipping case SP as in the present embodiment is particularly preferred.

Figure 14:
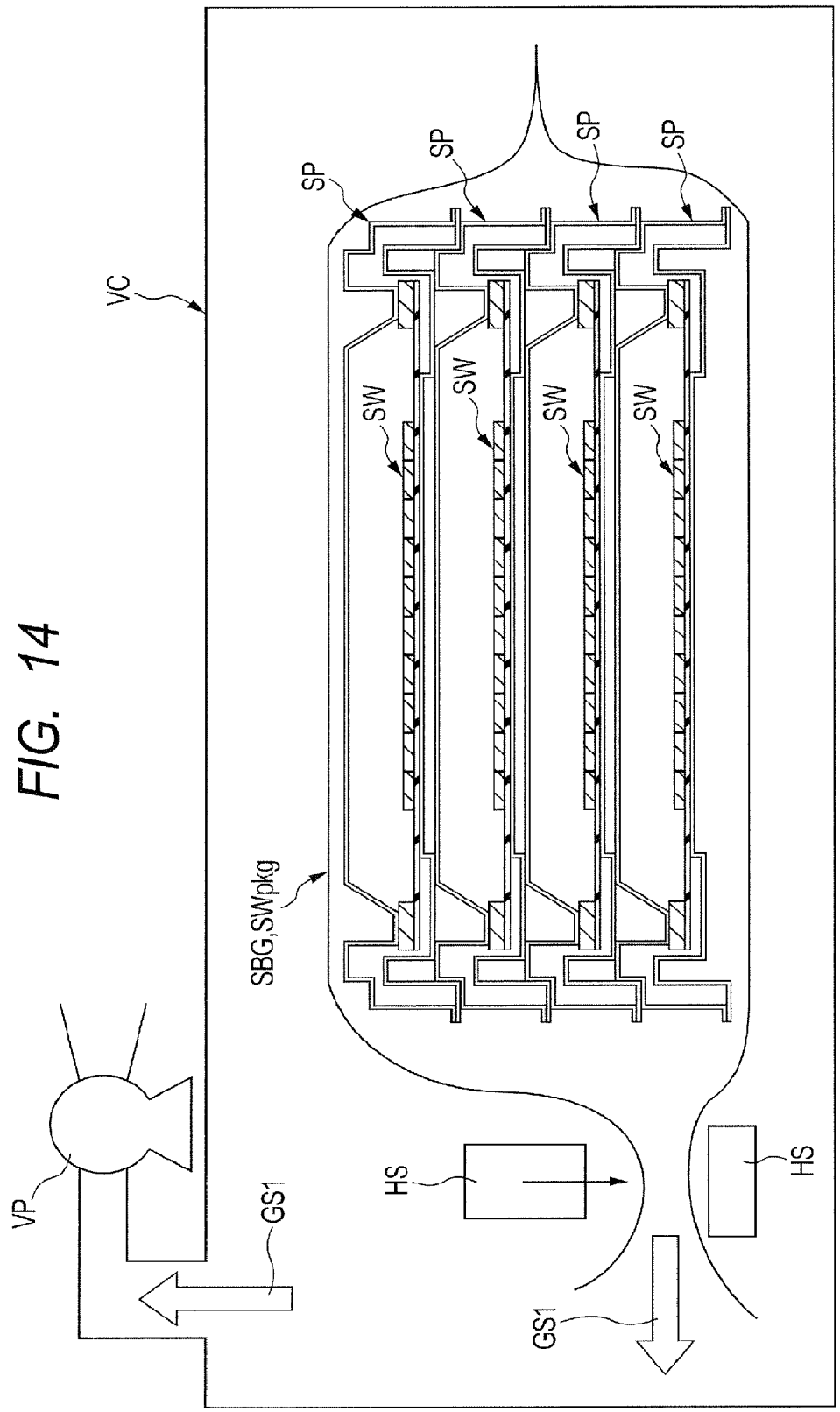
FIG. 14 is an explanatory view schematically showing vacuum packing of the housed sawn wafer in the vacuum packing step shown in FIG. 3.

Housing of one sawn wafer in one shipping case SP as in the present embodiment increases the volume of a shipping package that packs the shipping cases each housing therein one sawn wafer SW. As shown in FIG. 14, therefore, a structure in which a plurality of shipping cases SP can be stacked while being fitted to each other is preferred because the volume of an object to be conveyed can be reduced even if a large number of sawn wafers SW are conveyed.

Next, in the vacuum packing step, as shown in FIG. 14, the shipping case SP having the sawn wafer SW housed therein is placed in a shipping bag SBG and a gas GS1 is sucked from the shipping bag to evacuate the shipping case SP. FIG. 14 is an explanatory view schematically showing vacuum packing of the housed sawn wafer in the vacuum packing step shown in FIG. 3. FIG. 14 schematically shows the flow direction of the gas GS1 by an arrow.

In the present step, the shipping case SP is housed in the shipping bag SBG and the shipping bag SBG is sealed while being vacuumed. This means that so-called vacuum packing is performed. The term "vacuum" means a state obtained by reducing pressure by discharging air from an airtight space and it is not limited to a gas-free and absolute vacuum state.

The vacuum packing step is performed as schematically shown in FIG. 14, for example, by placing the shipping bag SBG having the shipping case SP housed therein in a vacuum chamber VC which is a container capable of having a pressure reduced state. To the vacuum chamber VC is coupled a vacuum pump VP, by which a gas GS1 in the space of the chamber VC can be forcibly discharged outside. In the vacuum chamber VC, a sealing apparatus HS for melting and sealing a portion of the shipping bag SBG by heat is provided. In the vacuum packing step, the shipping bag SBG is melted and the shipping bag SBG is thereby hermetically sealed while vacuuming the shipping bag SBG and the shipping case SP in the vacuum chamber VC.

When the gas GS1 is forcibly discharged as shown in FIG. 14, an internal gas can be discharged from a space, if any, between the internal space and the external space of the shipping case SP. In the present embodiment, as shown in FIG. 12, the shipping case SP has a ventilation route for coupling between the internal space and the external space of the shipping case SP. Such a structure enables to reduce the discharge time of the gas GS1 from the shipping case SP. In addition, it facilitates control of the flow of the gas GS1 when the gas GS1 is discharged from the shipping case SP and therefore facilitates control of the balance of atmospheric pressure in the internal space of the shipping case SP.

Next, in the shipping-package conveying step (also called "forwarding step"), a shipping package SWpkg obtained by hermetically sealing the shipping bag SBG shown in FIG. 14 is conveyed. Since the sawn wafer SW in the shipping package SWpkg is fixed in the shipping case SP while being vacuum packed, damage of the semiconductor chips CP (FIG. 12) or deterioration in the characteristics due to oxidation during conveyance can be suppressed. By making use of such a conveyance method, for example, a step of manufacturing the semiconductor chips CP (wafer step) and a step of fabricating a semiconductor package (fabrication step) can be performed at respectively difference places.

For example, when the wafer step and the fabrication step are performed by respectively different business operators, the shipping package SWpkg shown in FIG. 14 can be regarded as a product of a semiconductor device having therein a plurality of semiconductor chips CP vacuum-packed therein (refer to FIG. 12).

<Fabrication Step>

Figure 15:
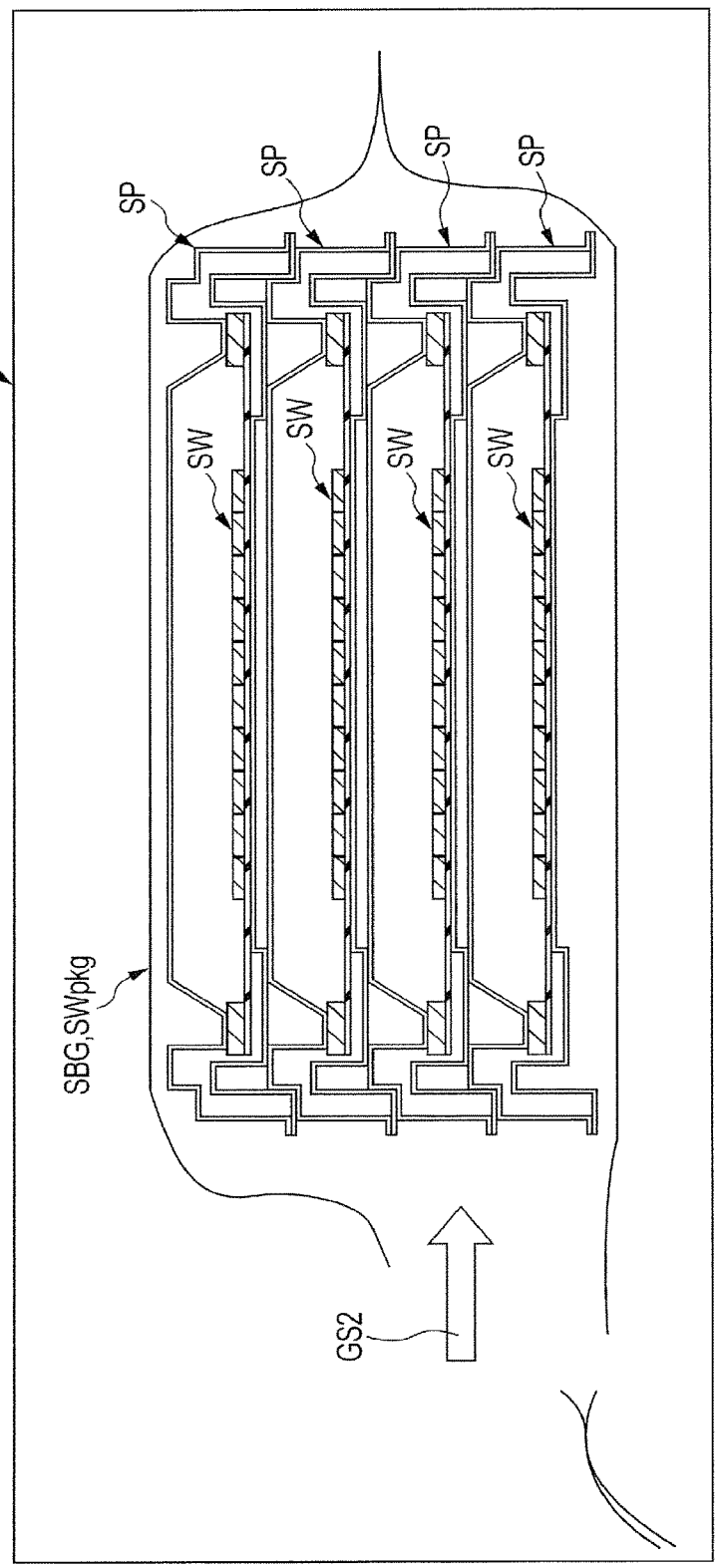
FIG. 15 is an explanatory view schematically showing opening of a hermetically sealed shipping bag in the package opening step shown in FIG. 3.
Figure 16:
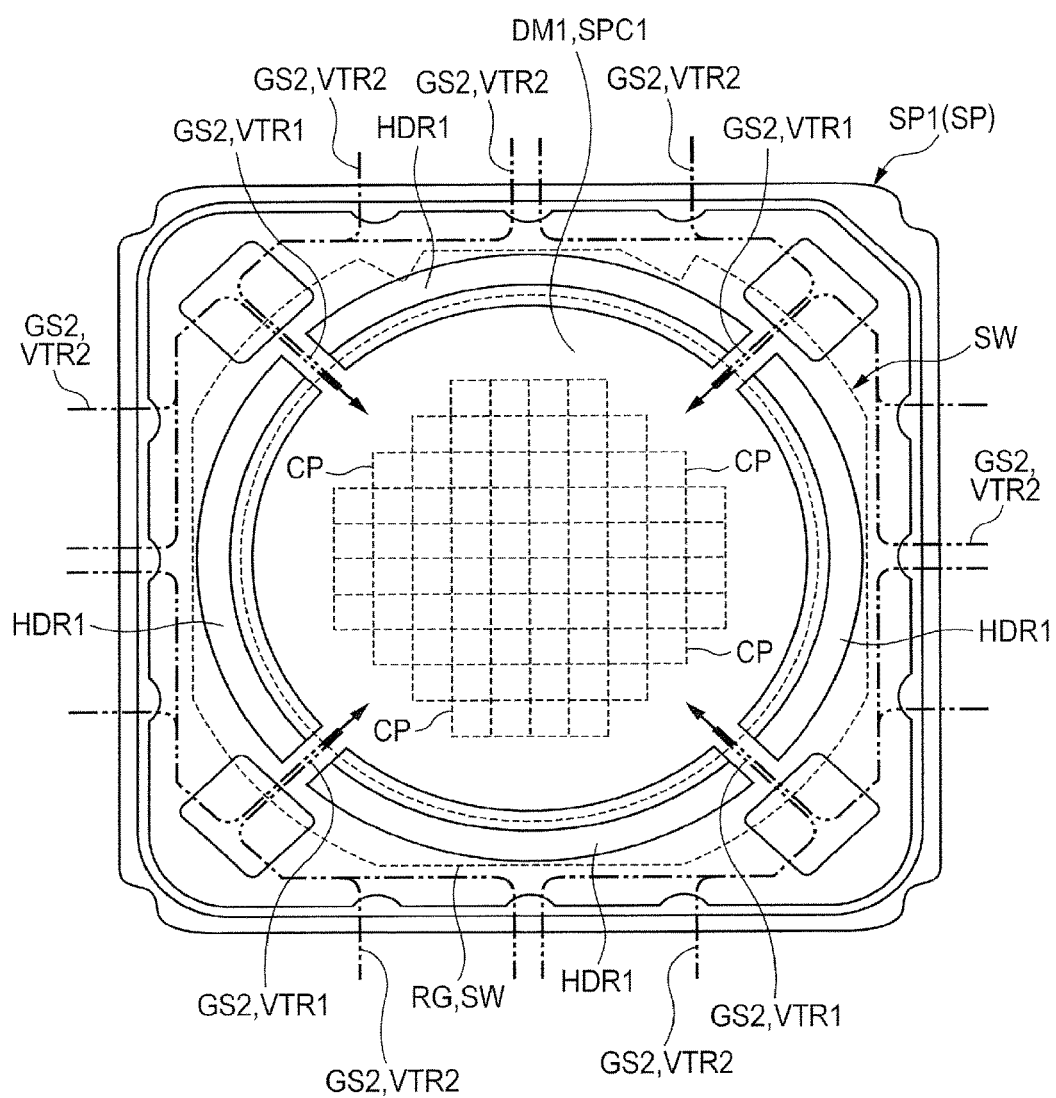
FIG. 16 is a plan view schematically showing a ventilation route which the shipping case shown in FIG. 10 has.
Figure 17:
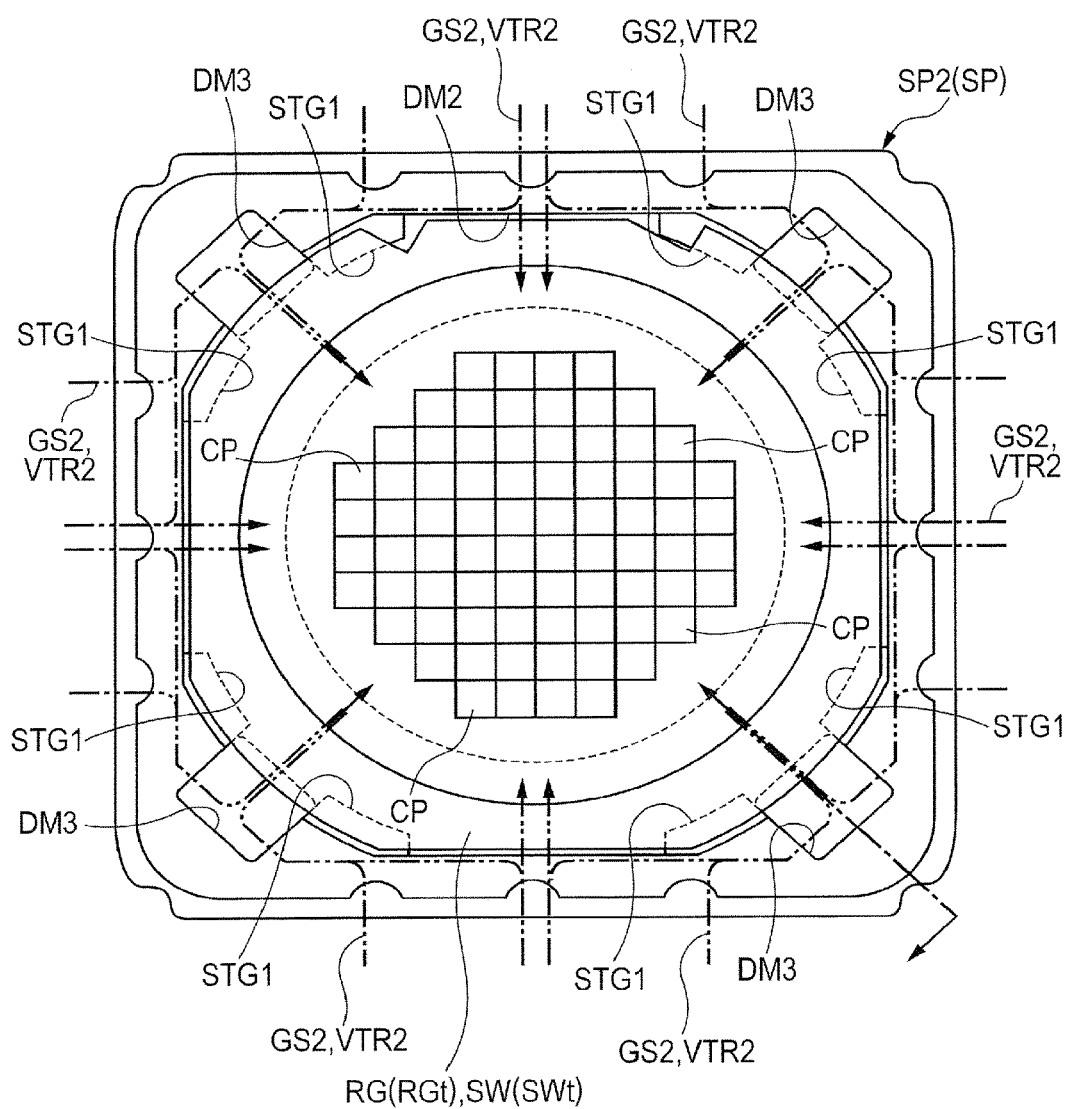
FIG. 17 is a plan view schematically showing a ventilation route which the shipping case shown in FIG. 11 has.

Next, the fabrication step shown in FIG. 3 will be described. FIG. 15 is an explanatory view schematically showing opening of the hermetically sealed shipping bag in the package opening step shown in FIG. 3. FIG. 16 is a plan view schematically showing a ventilation route which the shipping case shown in FIG. 10 has. FIG. 17 is a plan view schematically showing a ventilation route which the shipping case shown in FIG. 11 has.

In the base material providing step shown in FIG. 3, a base material on which the semiconductor chips CP shown in FIG. 12 are to be mounted is mounted. In the present embodiment, the wiring board 2 shown in FIGS. 1 and 2 is provided as the base material. The present embodiment describes a mode of mounting the semiconductor chip CP on the wiring board 2 shown in FIGS. 1 and 2 to simplify the description. As a modification example, however, it is also possible to provide a so-called multipiece substrate having a plurality of product formation regions corresponding to the wiring board 2, fabricate a plurality of semiconductor devices simultaneously, and then dividing it into individual product formation regions. This method can enhance the efficiency of the fabrication step.

In the package receiving step shown in FIG. 3, the shipping package SWpkg shown in FIG. 14 is received. Next, in the package opening step shown in FIG. 3, the hermetically-sealed shipping-package SWpkg shown in FIG. 14 is opened and the sawn wafer SW is taken out from the shipping case SP.

The package opening step includes a step of opening the hermetically sealed shipping bag SBG to increase the pressure in the shipping case SP and a step of taking out the sawn wafer SW from the shipping case SP. In the example shown in FIG. 15, a portion of the shipping bag SBG is cut in a clean room CR having a controlled cleanliness. By this cutting, the hermetically sealed shipping bag SBG is opened and the gas (for example, air) in the clean room GS2 enters the shipping bag SBG. The shipping case SP is not completely hermetically sealed so that the gas GS2 entering the shipping bag SBG enters the shipping case SP and increases the pressure in the shipping case SP.

The study by the present inventors has revealed that the individual semiconductor chips CP of the sawn wafer SW may be sometimes damaged in the shipping case SP during the package opening step, which depends on the structure of the shipping case SP of the sawn wafer SW.

Figure 20:
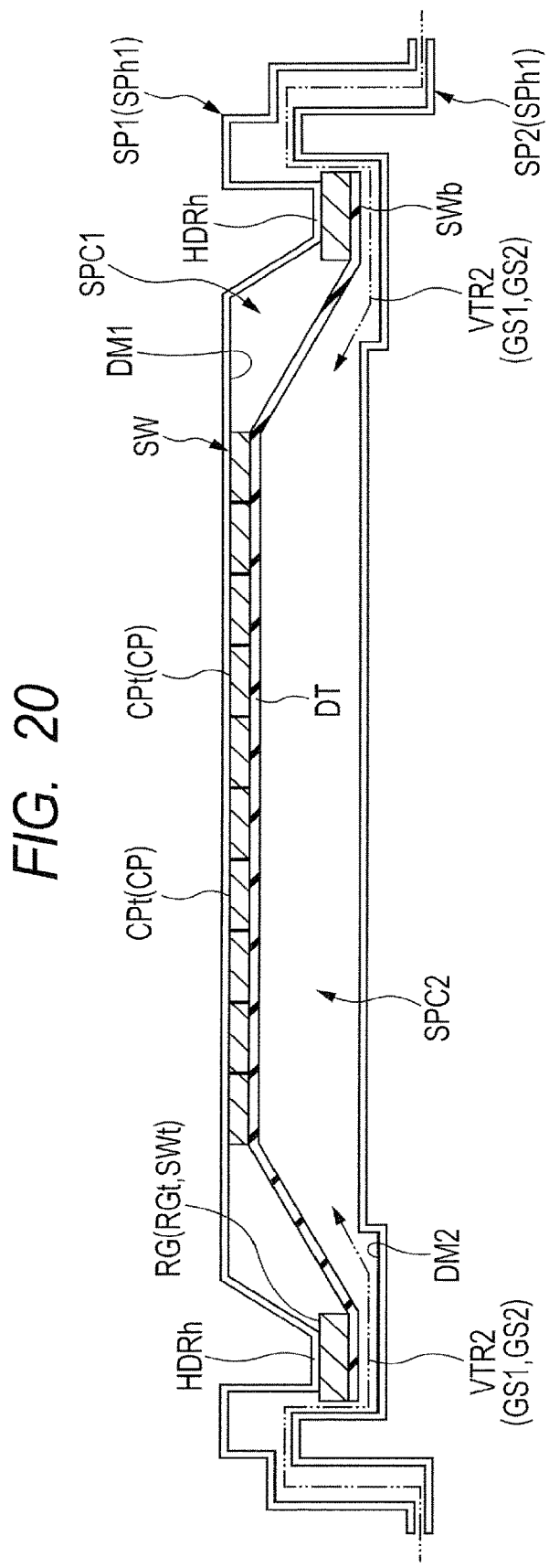
FIG. 20 is a cross-sectional view showing a study example corresponding to FIG. 12.

For example, a shipping case SPh1 of the study example shown in FIG. 20 is different from the shipping case SP of the present embodiment shown in FIG. 10 in that the ring holding portion HDRh of the lid portion SP1 continuously surrounds the periphery of the plurality of semiconductor chips CP. In addition, the shipping case SPh1 is different from the shipping case SP of the present embodiment shown in FIG. 10 in that the shipping case SPh1 has no ventilation route for coupling the space SPC1 formed by the recess portion DM1 and the upper surface SWt of the sawn wafer SW to the external space of the shipping case. In the modification example shown in FIG. 20, the ring holding portion HDRh and the upper surface RGt of the ring RG are brought into continuous contact with each other over the entire circumference. The space SPC1 formed by the recess portion DM1 and the upper surface SWt of the sawn wafer SW therefore becomes an airtight space, which prevents smooth passage of a gas between it and the external space.

In the above-mentioned vacuum packing step, a gas in the space SPC1 is easily discharged even from a small gap when the internal pressure of the space SPC1 is shifted from a normal pressure state (for example, 101.325 kPa) to a pressure reduced state. The space SPC1 can have a pressure reduced state even if the ring holding portion HDRh continuously surrounds the periphery of the plurality of semiconductor chips CP.

When the internal pressure of the space SPC1 is shifted from a pressure reduced state to a normal pressure state in the package opening step, however, the ring holding portion HDRh of the lid portion SP1 is pressed against the ring RG due to external force resulting from a difference between an internal pressure of the space SPC1 and a pressure of the external space. The ring holding portion HDRh continuously surrounding the periphery of the plurality of semiconductor chips therefore prevents formation of a route through which a gas enters the space SPC1.

In the body portion SP2 of the shipping case SPh1, a recess portion DM2 is formed and by the recess portion DM2 and the lower surface SWb of the sawn wafer SW, a space SPC2 is formed. Further, the body portion SP2 has therein a ventilation route VTR2 that is communicated with the recess portion DM2 and enables ventilation (passage) of the gas GS2 (for example, air) between the outside and the shipping case SP.

In the vacuum packing step, the gas GS1 in the space SPC2 is discharged outside the shipping case SPh1 via the ventilation route VTR2. In the package opening step, on the other hand, the gas GS2 in the external space of the shipping case SPh1 enters the space SPC2 via the ventilation route VTR2.

Thus, when the gas GS2 hardly enters the space SPC1 and the gas GS2 easily enters the space SPC2, the internal pressure of the space SPC2 becomes larger than the internal pressure of the space SPC1. When a pressure difference between the space SPC1 and the space SPC2 becomes large, the dicing tape DT, which is a resin tape, attached to the plurality of semiconductor chips CP of the sawn wafer SW is deformed by the external force resulting from the pressure difference. For example, when the internal pressure of the space SPC2 becomes relatively large as shown in FIG. 20, the dicing tape DT is deformed so as to push up the plurality of semiconductor chips CP. The main surface CPt of the semiconductor chips CP may then be brought into contact with the inner surface of the recess portion DM1 of the lid portion SPh1 as shown in FIG. 20, though depending on the degree of the deformation of the dicing tape DT.

As described above, the main surface CPt of the semiconductor chip CP is a surface placed on the side of the circuit formation surface and when the main surface CPt is brought into contact with another member, the circuit formed on the semiconductor chip CP may be damaged. In particular, in the case of a so-called image sensor chip having a plurality of image sensor elements (light receiving elements) on the side of the main surface CPt as the semiconductor chip CP of the present embodiment, damage of the main surface CPt may cause deterioration in light receiving function.

As another study example of the shipping case SPh1 shown in FIG. 20, when the ventilation route VTR2 communicated with the recess portion DM2 is not formed, both the space SPC1 and the space SPC2 become air tight so that deformation of the dicing tape DT can be prevented. In this case, however, the gas GS2 has difficulty in entering both the space SPC1 and the space SPC2 and the internal pressure of the shipping case is maintained under a pressure reduced state, making it difficult to release the lid portion SP1 from the body portion SP2.

The shipping case SP of the present embodiment has, as shown in FIG. 16, the ventilation route VTR1 communicated with the recess portion DM1 of the lid portion SP1. As shown in FIG. 13, the ventilation route VTR1 couples the space SPC1 on the side of the upper surface SWt, of the upper surface SWt and the lower surface SWb of the sawn wafer SW, on which the plurality of semiconductor chips is retained to the external space. This means that the space SPC1 in the recess portion DM1 of the lid portion SP1 of the shipping case SP enables ventilation of the gas GS2 between the space SPC1 and the external space of the shipping case SP via the ventilation route VTR1.

In the example shown in FIGS. 13 and 16, the ventilation route VTR1 is coupled to the ventilation route VTR2 that communicates the space SPC2 (refer to FIG. 13) with the external space. In the package opening step, the gas GS2 of the external space of the shipping case SP is supplied to the space SPC1 in the recess portion DM1 of the lid portion SP1, passing through the ventilation route VTR2 and the ventilation route VTR1. In the package opening step, the gas GS2 in the external space of the shipping case SP is supplied to the space SPC2 in the recess portion DM2 of the body portion SP2 shown in FIG. 13, passing through the ventilation route VTR2.

By coupling the outside of the shipping case SP to the space SPC1 in the recess portion DM1 via the ventilation route VTR1 communicated with the recess portion DM1 of the lid portion SP1 as in the present embodiment, the gas GS2 can be supplied stably to the space SPC1 in the package opening step. This makes it possible to suppress occurrence of a pressure difference between the space SPC1 and the space SPC2 shown in FIG. 13 and thereby suppress deformation of the dicing tape DT resulting from the pressure difference. As a result, the plurality of semiconductor chips CP attached to the dicing tape DT can be suppressed from being damaged due to contact with the lid portion SP1.

As a modification example of the present embodiment, the ventilation route VTR1 and the ventilation route VTR2 can be made independent without coupling them to each other. From the standpoint of reducing a pressure difference between the space SPC1 and the space SPC2, however, the ventilation route VTR1 is preferably coupled to the ventilation route VTR2 as in the present embodiment. When the ventilation route VTR1 and the ventilation route VTR2 are coupled to each other, an increases in pressure in one of the space SPC1 and the space SPC2 leads to an increase in an amount of the gas GS2 entering the other one so that a pressure difference can be reduced.

As shown in FIG. 16, the lid portion SP1 of the shipping case SP of the present embodiment has, outside the recess portion DM1, a ring holding portion HDR1 for pressing the ring RG of the sawn wafer SW to fix the ring RG. In plan view, the ventilation route VTR1 communicates a space inside the ring RG with a space outside the ring RG. This means that the ventilation route VTR1 is not present on the plurality of semiconductor chips CP covered with the recess portion DM1 but is present at the periphery of the semiconductor chips CP. In the package opening step, when the gas GS2 enters the space SPC1 from the external space as shown in FIG. 16, such a structure can prevent direct blowing of the gas GS2 to the semiconductor chips. As a result, attachment of foreign matters to the semiconductor chips CP can be prevented.

As shown in FIG. 16, the shipping case SP of the present embodiment has a plurality of ventilation routes VTR1 around the recess portion DM1. This makes it possible to increase the cross-sectional area of the ventilation route VTR1 and thereby decrease the flow rate of the gas GS2 passing through the ventilation route VTR1. As a result, there is a reduced possibility of the gas GS2 conveying foreign matters to the semiconductor chips CP.

As shown in FIG. 16, the shipping case SP of the present embodiment has a plurality of ring holding portions HDR1 around the recess portion DM1. By holding the ring RG at a plurality of positions around the recess portion DM1 in such a manner, the ring RG can be fixed with improved strength. Improvement in the fixing strength of the ring RG leads to suppression of the semiconductor chips CP from being damaged due to movement of the ring RG during conveyance.

In the example shown in FIG. 16, in plan view, the ventilation route VTR1 communicates the space in the recess portion DM1 with the space outside the ring holding portion HDR1 so as to penetrate through a portion of the ring holding portion HDR1. This means that at a position overlapping with the ventilation route VTR1 in the thickness direction, the upper surface RGt of the ring RG does not come into contact with the lid portion SP1 as shown in FIG. 13. In other words, a member constituting the lid portion SP1 has, at a portion of the ventilation route VTR1, a dome-like shape so as to cover the ventilation route VTR1. Further, in other words, a recess portion formed at a portion of the ring holding portion HDR1 contiguous to the ring RG becomes a first ventilation route VTR1. The ventilation route VTR1 having such a dome-like shape can be formed more easily by using a molding die when the lid portion SP1 is manufactured.

As a modification example of the present embodiment, there may be a mode of forming the body portion SP2 shown in FIG. 12 without the recess portion DM2. In this case, the lower surface SWb of the sawn wafer SW, that is, the whole lower surface DTb of the dicing tape DT is brought into contact with the body portion SP2. The body portion SP2 formed without the recess portion DM2 may cause difficulty in releasing the sawn wafer SW from the body portion SP2 because they adhere closely by vacuum packing. From the standpoint of facilitating release of the sawn wafer SW from the body portion SP2, the body portion SP2 preferably has the recess portion DM2 that covers the lower surface SWb of the sawn wafer SW.

From the standpoint of improving the releasability between the body portion SP2 and the sawn wafer SW, the body portion SP2 has preferably a ventilation route VTR2 that is communicated with the recess portion DM2 and enables ventilation of a gas between the external space of the shipping case SP and the space SPC2. When the sawn wafer SW is housed in the recess portion DM2, the inner dimensions of the recess portion DM2 cannot easily be set completely equal to the outer dimensions of the sawn wafer SW. A gap therefore appears between the outer edge portion of the ring RG of the sawn wafer SW and the wall surface of the recess portion DM2. The ventilation route VTR2 communicated with the recess portion DM2 may make use of this gap.

From the standpoint of controlling the flow rate of the gas GS2 entering the recess portion DM2, formation of a ventilation route VTR2 in addition to the above-mentioned gap is preferred. For example, in the present embodiment, as shown in FIG. 17, the recess portion DM2 has therein a plurality of support portions STG1 for supporting the lower surface SWb (refer to FIG. 13) of the sawn wafer SW and the support portions STG1 have thereon the sawn wafer SW. A space that enables ventilation of the gas GS2 is therefore formed between the support portions STG1 adjacent to each other among the plurality of support portions STG1. In the present embodiment, the space between the support portions STG1 is made use of as the ventilation route VTR2.

In the present embodiment, as shown in FIG. 13, a ventilation route that couples the external space of the shipping case SP to the space SPC1 in the recess portion DM1 is provided with a space SPC3 where the ventilation route has a partially enlarged cross-sectional area. In the example of the present embodiment, the body portion SP2 having a square shape in a plan view as shown in FIG. 17 has, at four corner portions thereof, recess portion DM3 having a depth larger than that of the recess portion DM2, respectively. As shown in FIG. 13, in the space SPC3 surrounded by the recess portion DM2 and the lid portion SP1, the ventilation route has a cross-sectional area relatively larger than that of another portion of the ventilation route VTR1.

When the ventilation route has therein the space SPC3 at which the ventilation route has a partially enlarged cross-sectional area, the flow rate of the gas GS2 decreases in the space SPC3. In the package opening step, therefore, even when the gas GS2 is sent to the space SPC1 and the gas GS2 contains foreign matters, the foreign matters can be dropped in the space SPC3 by causing the gas GS2 to pass through the space SPC3. This means that entering of the foreign matters into the space SPC1 can be suppressed by providing, in the ventilation route, the space SPC3 at which the ventilation route has a partially enlarged cross-sectional area.

From the standpoint of reducing the flow rate of the gas GS2 to the space SPC1 in which the plurality of semiconductor chips CP is retained, the volume of the space SPC1 shown in FIG. 12 is preferably made smaller than that of the space SPC2.

As shown in FIGS. 12 and 13, the recess portion DM2 of the body portion SP2 has therein, in the thickness direction of the plurality of semiconductor chips CP, a support portion STG2 at a position overlapping with the plurality of semiconductor chips attached to the dicing tape DT. The support portion STG2 is a portion (swelling portion) that swells upward relative to the bottom surface of the recess portion DM2. The height of the upper surface of the support portion STG2 is the same as the height of a support surface of the plurality of support portions STG1 shown in FIG. 13 and the lower surface DTb of the dicing tape DT is brought into contact with the upper surface of the support portion STG2. In other words, the support portion STG2 has a support surface which is brought into contact with the lower surface DTb of the dicing tape DT and thereby support it in a region of the sawn wafer SW to which the plurality of semiconductor chips CP has been attached.

Thus, by providing the support portion STG2 below the plurality of semiconductor chips CP, downward deformation of the dicing tape DT can be suppressed even when a pressure of the space SPC1 becomes greater than that of the space SPC2.

Since the semiconductor chips CP are held on the side of the upper surface SWt of the sawn wafer SW, the semiconductor chips CP are hardly brought into contact with the shipping case SP even when the dicing tape DT is deformed downward. From the standpoint of suppressing the semiconductor chips CP from being released from the dicing tape DT at the time of the downward deformation of the dicing tape DT, downward deformation of the dicing tape DT is preferably suppressed.

After completion of the package opening step shown in FIG. 3, the sawn wafer SW taken out from the shipping case SP is conveyed to a place where the die bonding step shown in FIG. 3 is performed. In the die bonding step, as shown in FIG. 2, the semiconductor chips CP are mounted on a chip mounting surface of the wiring board 2 which is a base material. At this time, the dicing tape DT of the sawn wafer SW shown in FIG. 8 is, for example, exposed to ultraviolet rays to cure an ultraviolet curing resin component contained in the adhesive layer of the dicing tape DT. This facilitates pick-up of the semiconductor chips CP from the dicing tape DT.

In the example shown in FIG. 2, the semiconductor chips CP are mounted on the wiring board 2 with the main surface CPb being placed to face the upper surface 2t of the wiring board 2. Such a mounting method is called face-up packaging method. In FIG. 2, the wiring board 2 is given as an example of the base material so that the semiconductor chips CP are mounted on the wiring board 2 in the present step, but there are various modification examples of the base material. For example, when a leadframe having a die pad (chip mounting portion) and a plurality of leads provided separately from the die pad is used as the base material, the semiconductor chips CP are mounted on the die pad, which is a chip mounting portion, in the present step.

Next, in the wire bonding step, as shown in FIG. 2, the semiconductor chip CP and the wiring board 2a are electrically coupled to each other via a plurality of wires BW. In the example shown in FIG. 2, after one of the end portions of the wire BW is bonded to the pad PD of the semiconductor chip CP, the other end portion of the wire BW is bonded to a terminal 2BF of the wiring board 2.

Next, in the cover mounting step, as shown in FIG. 2, a cover member CG for covering the semiconductor chip CP and the plurality of wires BW are mounted on the wiring board 2 to protect the wires BW. In the present embodiment, the semiconductor chip CP must be exposed to light for application convenience so that an example of mounting the cover member CG is given. When covering of the semiconductor chip CP with a resin does not cause any problem, the semiconductor chip and the plurality of wires BW may be sealed with a resin.

Next, in the ball mounting step, as shown in FIG. 2, a plurality of solder balls SB are installed on the side of the lower surface 2b of the wiring board 2, which is a packaging surface. In the present step, the wiring board 2 is turned upside down and the solder balls SB are placed on the exposed surface of a land 2LD formed on the lower surface 2b of the wiring board 2. Then, reflow treatment (treatment of heating a solder component to melt and bond it and then, cooling) is performed to attach the solder balls SB to the wiring board 2.

By the above-mentioned steps, the semiconductor package PKG1 as described referring to FIGS. 1 and 2 can be obtained. Then, necessary inspections such as external inspection and electrical test are performed, followed by forwarding or packaging on an unillustrated package substrate.

The problem described above in the package opening step becomes apparent by opening the vacuum packed shipping bag SBG. The shipping package having therein a vacuum packed sawn wafer SW is obtained by vacuum packing on the premise that the semiconductor chips CP are used after opening the shipping package. Therefore, a potential problem occurs after vacuum packaging described above in the wafer step is performed. In other words, in the present embodiment, vacuum packing is performed after a potential problem is solved in the wafer step.

The invention made by the present inventors has been described specifically based on the embodiment, but the invention is not limited to the above-mentioned embodiment. It is needless to say that it can be changed in various ways without departing from the gist of the invention. The description on the above-mentioned embodiment includes a description on various modification examples, but typical modification examples other than them will next be described.

Modification Example 1

For example, in the present embodiment, the semiconductor chip CP having, on the main surface CPt thereof, the image sensor element LSE in plan view has been mentioned as an example of a semiconductor chip. When the semiconductor chip has the image sensor element LSE, damage of the image sensor element LSE may cause deterioration in the characteristics of the semiconductor chip CP so that particularly, the method described in the above embodiment is effective. This method may also be applied to a semiconductor chip having, on the main surface CPt thereof, no image sensor element LSE. For example, even when the main surface CPt of the semiconductor chip is covered with a protection film, the plurality of pads PD shown in FIG. 1 must be exposed from the protection film. In this case, damage of the pad PD may cause deterioration in the electrical characteristics of the semiconductor chip.

Modification Example 2

Figure 18:
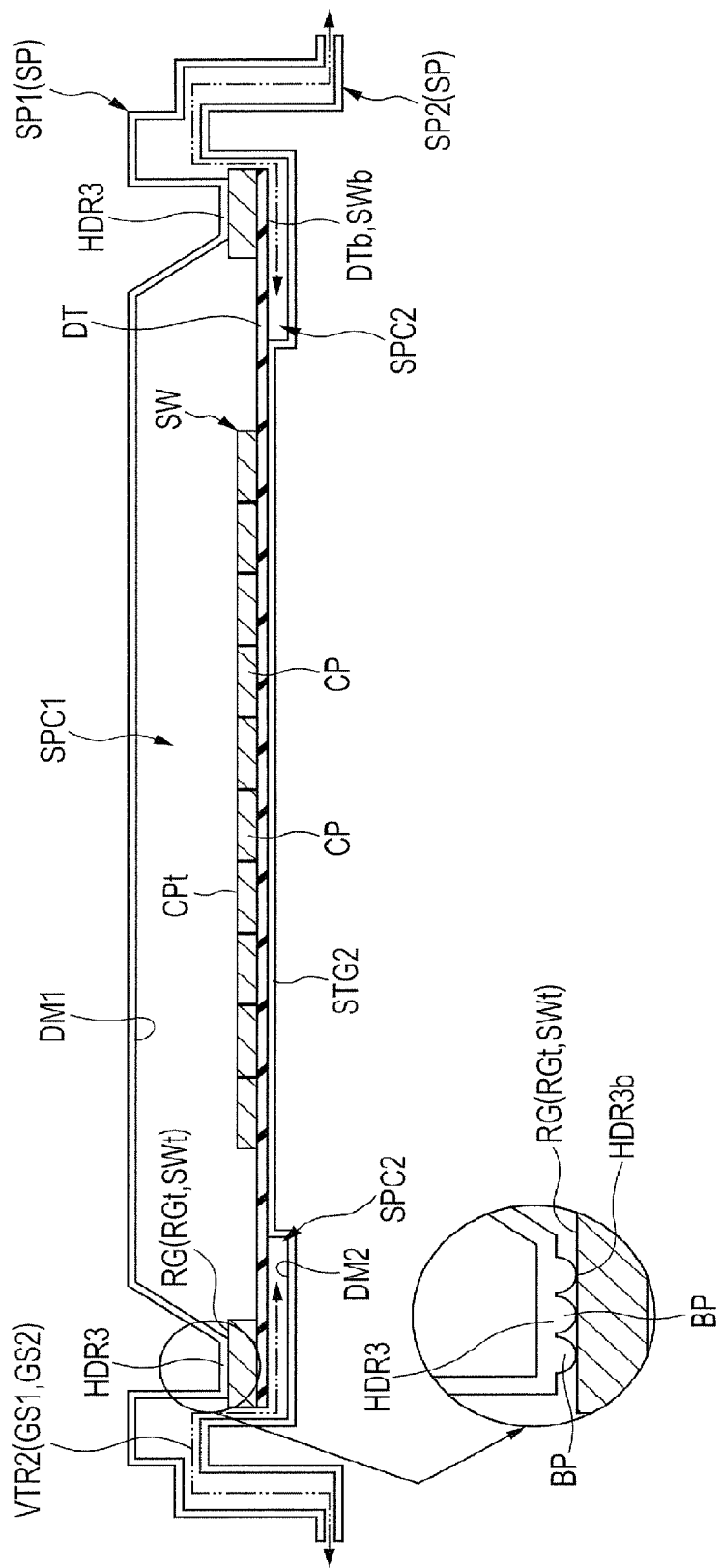
FIG. 18 is a cross-sectional view showing a modification example of FIG. 12.

In the above embodiment, the mode in which the surface of the ring holding portion HDR1 contiguous to the ring RG, that is, the ring holding surface HDR1b is flat as shown in FIG. 12 has been described. As a modification example, however, similar to a ring holding surface HDR3b of a ring holding portion HDR3 shown in FIG. 18, the surface may be an uneven surface having a plurality of protruding portions BP. In the structure in which the ring RG is held by bringing the plurality of protruding portions BP of the ring holding portion HDR3 into contact with the upper surface RGt of the ring RG, a gap between two adjacent protruding portions BP functions as a ventilation route communicated with the recess portion DM1. In this case, even when the ventilation route VTR1 as shown in FIG. 10 is not provided, the gas GS2 can be allowed to enter the space SPC1 in the package opening step.

In the structure in which the plurality of protruding portions BP are brought into contact with the ring RG, dust may be generated due to friction between the ring RG and the protruding portions BP. From the standpoint of suppressing dust generation, therefore, the ring holding surface is preferably flat as the ring holding surface HDR1b of the ring holding portion HDR1 shown in FIG. 12.

Modification Example 3

In the above embodiment, the mode in which the sawn wafer SW is housed in the shipping case SP while exposing the main surface CPt of the plurality of semiconductor chips CP has been described. As in the modification example shown in FIG. 19, a protection tape MT that covers the main surface CPt of the plurality of semiconductor chips CP may be attached to the upper surface SWt of the sawn wafer SW. In this case, the main surface CPt of the semiconductor chips CP covered with the protection tape MT becomes more resistant to damage.

Figure 19:
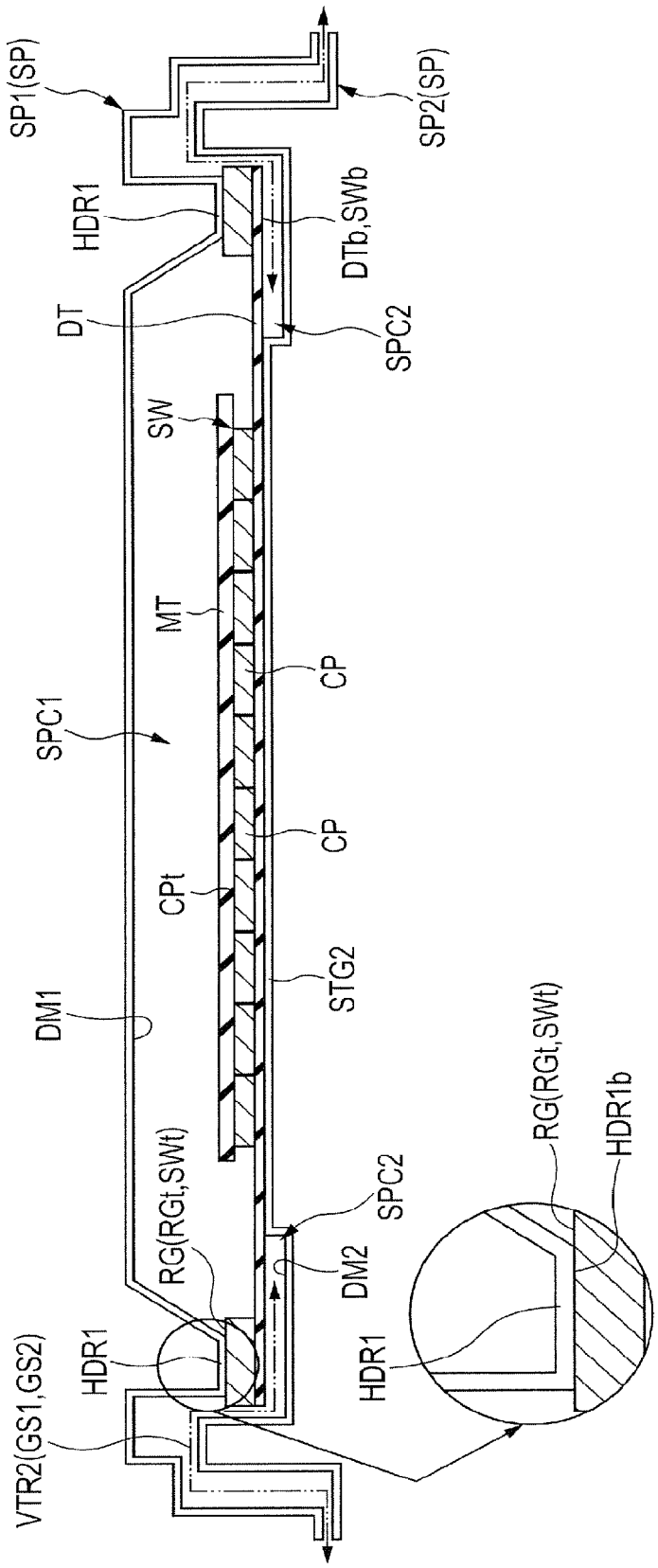
FIG. 19 is a cross-sectional view showing another modification example of FIG. 12.

As shown in FIG. 19, when the protection tape MT is attached to the upper surface SWt of the sawn wafer SW, it is preferred to attach it after the dicing step and before the housing-in-case step shown in FIG. 3.

In the example shown in FIG. 19, the protection tape MT is attached to the plurality of semiconductor chips CP and the upper surface RGt of the ring RG is exposed from the protection tape MT. As a further modification example of FIG. 19, the protection tape MT may be attached so as to cover the semiconductor chips and the upper surface RGt of the ring RG.

Even when the thickness of the ring RG is different from that of the semiconductor chips CP, the upper surface RGt of the ring RG is preferably exposed from the protection tape MT from the standpoint of surely attaching the protection tape MT to the main surface CPt of the semiconductor chips CP.

Modification Example 4

In the above embodiment, the semiconductor package having semiconductor chips CP mounted on the wiring board 2, a base material, has been described as an example of a semiconductor package. The structure of the semiconductor package however has various modification examples. For example, a semiconductor package using a lead frame having a plurality of leads adjacent to a chip mounting portion may be used as the base material.

Modification Example 5

These modification examples can be used in combination without departing from the gist of the technical concept described above in the embodiment.

What is claimed is:

1. A case for housing and supporting a sawn wafer, the case comprising:
   a first case portion having a first recessed portion;
   a second case portion having a second recessed portion;
   the first and second case portions being detachably attached to each other so as to house the sawn wafer in a space formed by the first and second recessed portions;
   the first case portion further including first support portions positioned outside the first recessed portion so as to support a portion of an upper surface of the sawn wafer;
   the second case portion further including a second support portion arranged in the second recessed portion so as to support a portion of a lower surface of the sawn wafer;
   the first case portion further including a first ventilation route coupling a space external to the case with the first recessed portion; and
   the first ventilation route being configured to allow the discharge of a gas from the first recessed portion into the space outside the case.

2. The case according to claim 1, wherein the sawn wafer includes a plurality of diced semiconductor chips supported on an adhesive tape attached to an annular ring.

3. The case according to claim 2, wherein the first support portions support a portion of the upper surface of the sawn wafer by pressing an upper surface of the annular ring.

4. The case according to claim 3, wherein the first support portions are formed so as to be contiguous with the upper surface of the annular ring and so as to press the upper surface of the annular ring from a side surface of the annular ring.

5. The case according to claim 2, wherein the second support portions support the lower surface of the sawn wafer by contacting a bottom surface of the adhesive tape positioned below the annular ring.

6. The case according to claim 2, wherein, in plan view, the first ventilation route connects a space inside the annular ring with a space outside the annular ring.

7. The case according to claim 6, wherein, in plan view, the first ventilation route connects the space in the first recessed portion with space outside the first support portions by penetrating through the first support portions.

8. The case according to claim 7, wherein a portion of the first ventilation route has a partially enlarged cross-sectional area.

9. The case according to claim 1, wherein the second case portion further includes a second ventilation route which couples a space outside the case with the second recessed portion, the second ventilation route being configured to allow the discharge of a gas from the second recessed portion into the space outside the case.

10. The case according to claim 9, wherein the first ventilation route and the second ventilation route are connected with each other.

11. The case according to claim 9, wherein the second ventilation route includes a gap formed between an outer edge portion of the sawn wafer and a wall surface of the second recessed portion.

12. The case according to claim 1, wherein a volume of a first space formed by the first recessed portion and the upper surface of the sawn wafer is larger than a volume of a second space formed by the second recessed portion and the lower surface of the sawn wafer.

13. The case according to claim 1, wherein each of the plurality of diced semiconductor chips includes an image sensor element.

14. The case according to claim 13, further comprising a protection tape attached onto the sawn wafer to cover the plurality of semiconductor chips.

15. The case according to claim 1, wherein the case is a shipping case configured to restrict movement of the sawn wafer within the case during shipment of the sawn wafer to another location.

16. The case according to claim 15, wherein the case is configured to be opened for removal of the sawn wafer by detaching the first case portion from the second case portion.

17. The case according to claim 2, wherein the second case portion further includes a second ventilation route which couples a space outside the case with the second recessed portion, the second ventilation route being configured to allow the discharge of a gas from the second recessed portion into the space outside the case.

18. The case according to claim 17, wherein the first ventilation route and the second ventilation route are connected with each other.

19. The case according to claim 17, wherein the second ventilation route includes a gap formed between an outer edge portion of the annular ring and a wall surface of the second recessed portion.

* * * * *